US 6,683,792 B2

(12) United States Patent
Shirakami et al.

(10) Patent No.: US 6,683,792 B2
(45) Date of Patent: Jan. 27, 2004

(54) HOUSING STRUCTURE FOR ULTRAFAST COMMUNICATION APPARATUS

(75) Inventors: Takashi Shirakami, Kawasaki (JP); Naoya Yamazaki, Kawasaki (JP); Kazuhiro Iino, Kawasaki (JP); Yoshiaki Tada, Kawasaki (JP); Hiroshi Katagiri, Kawasaki (JP); Yoshinori Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/294,151

(22) Filed: Nov. 14, 2002

(65) Prior Publication Data
US 2003/0214798 A1 Nov. 20, 2003

(30) Foreign Application Priority Data
May 14, 2002 (JP) .......................... 2002-139122

(51) Int. Cl.[7] .................. H05K 7/02; H05K 9/00; H01R 12/00
(52) U.S. Cl. ............... 361/796; 361/800; 361/816; 361/818; 361/788; 361/799; 174/35 R; 174/356 C; 211/41.17
(58) Field of Search ................ 361/796, 788, 361/797, 798, 799, 800, 801, 802, 816, 818; 174/35 R, 35 GC, 35 MS; 211/41.17

(56) References Cited

U.S. PATENT DOCUMENTS

| 4,762,966 A | * | 8/1988 | Kosanda ................ 174/35 GC |
| 5,023,754 A | * | 6/1991 | Aug et al. ................... 361/415 |
| 5,381,314 A | * | 1/1995 | Rudy, Jr. et al. ............ 361/712 |
| 5,388,995 A | * | 2/1995 | Rudy, Jr. et al. .............. 439/61 |
| 5,402,320 A | * | 3/1995 | Kielstra et al. ............ 361/796 |
| 5,652,697 A | * | 7/1997 | Le ............................. 361/788 |
| 5,929,377 A | * | 7/1999 | Hamilton et al. ......... 174/35 R |
| 6,000,464 A | * | 12/1999 | Scafidi et al. .......... 165/104.33 |
| 6,080,930 A | * | 6/2000 | Lommen et al. ........ 174/35 GC |
| 6,151,215 A | * | 11/2000 | Hoffman ..................... 361/704 |
| 6,166,919 A | * | 12/2000 | Nicolici et al. ............. 361/800 |
| 6,195,266 B1 | * | 2/2001 | Padgett et al. .............. 361/799 |
| 6,204,444 B1 | * | 3/2001 | Pugliese et al. ....... 174/35 GC |
| 6,219,258 B1 | * | 4/2001 | Denzene et al. ............ 361/816 |
| 6,239,984 B1 | * | 5/2001 | Koradia et al. ............. 361/784 |
| 6,285,563 B1 | * | 9/2001 | Nelson et al. .............. 361/784 |
| 6,335,868 B1 | * | 1/2002 | Butterbaugh et al. ....... 361/796 |
| 6,359,789 B1 | * | 3/2002 | Imabayashi et al. ........ 361/796 |
| 6,395,976 B1 | * | 5/2002 | Koradia et al. ........ 174/35 GC |
| 6,483,023 B1 | * | 11/2002 | Jacques ................. 174/35 GC |
| 6,590,153 B1 | * | 7/2003 | Kohan ........................ 174/35 C |
| 6,618,270 B2 | * | 9/2003 | Babin et al. ................ 361/818 |

FOREIGN PATENT DOCUMENTS

DE 19609887 * 7/1997 ............ H05K/5/00

* cited by examiner

Primary Examiner—David Martin
Assistant Examiner—Dameon E. Levi
(74) Attorney, Agent, or Firm—Katten Muchin Zavis Rosenman

(57) ABSTRACT

A communication apparatus including a metallic shelf having a pair of side plates, a back wiring board mounted in the shelf on the back side thereof and having a plurality of first connectors and a solid ground pattern, and upper and lower guide plates mounted in the shelf, each guide plate having a plurality of guide rails and a plurality of vent holes. A first shield board having numerous openings is mounted on the upper guide plate, and a second shield board having numerous openings is mounted on the lower guide plate. A plurality of plug-in units are mounted in the shelf so as to be inserted along the guide rails of the upper and lower guide plates.

13 Claims, 32 Drawing Sheets

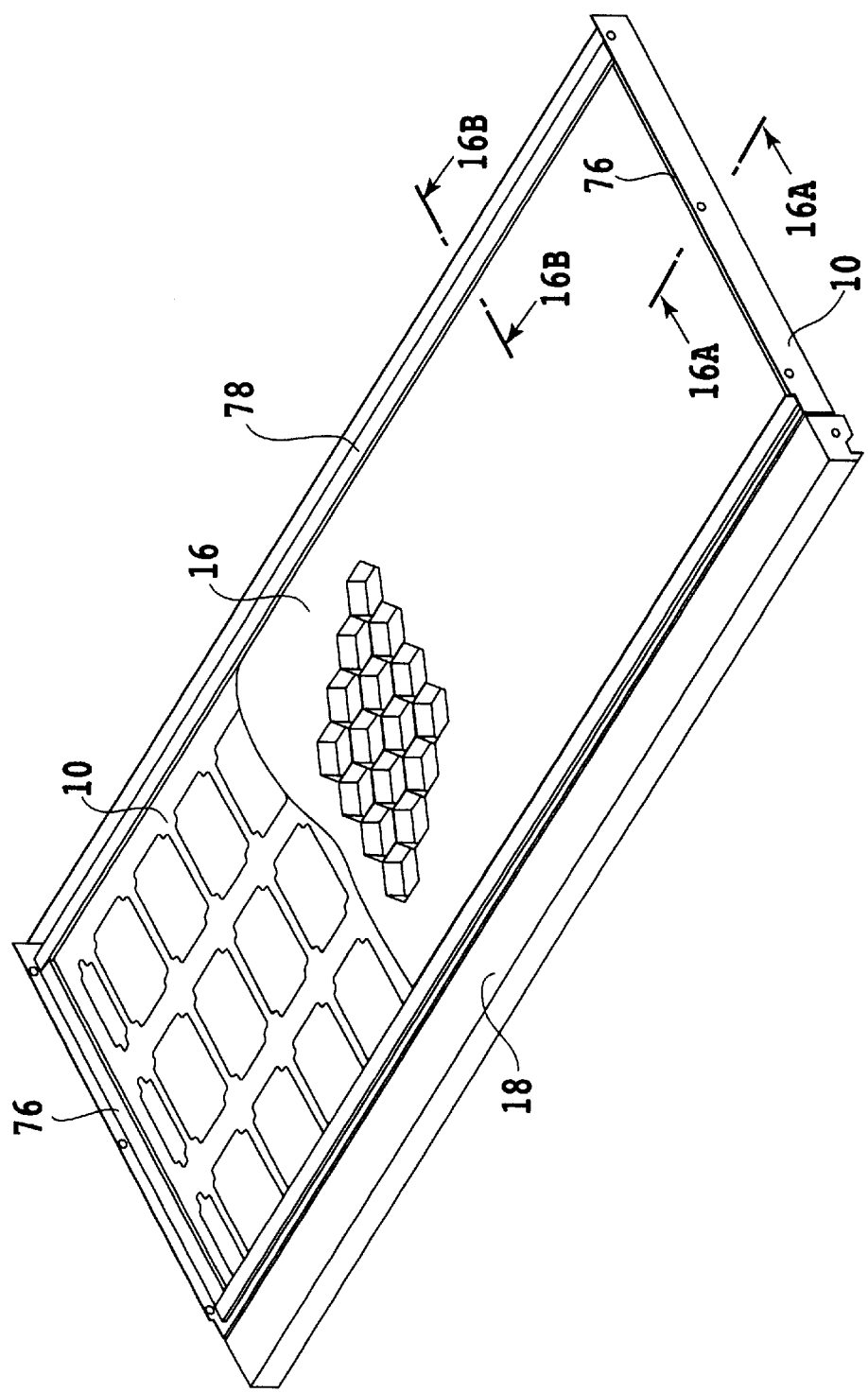

HOUSING STRUCTURE FOR ULTRAFAST COMMUNICATION APPARATUS

BACKGROUND OF THE INVENTION

1. Field of the Invention

The present invention relates generally to a communication apparatus, and more particularly to a housing structure for an ultrafast communication apparatus.

2. Description of the Related Art

A communication apparatus such as a transmission device and a switching device is configured by vertically mounting a plurality of plug-in units (PIU) to a back wiring board mounted in a shelf. Each plug-in unit is provided by an electronic circuit package. That is, each plug-in unit includes a printed wiring board and a plurality of electronic components such as LSIs having electronic circuits mounted on the printed wiring board. By vertically mounting the package type plug-in units to the back wiring board mounted in the shelf as mentioned above, the communication apparatus can be simplified and economized in design, and can be improved in maintainability.

In high-speed transmission, it is necessary to ensure a capability of resisting EMI. As conventional countermeasures against EMI, each plug-in unit is constructed of a box-shaped structure to thereby realize an electromagnetically sealed structure. However, such countermeasures against EMI have disadvantages that the structure of each plug-in unit is complicated and that a cost increase is invited. Further, also in a communication apparatus having a shielding structure using a gasket, all opening portions of the communication apparatus are not managed by a cutoff frequency, and it is hard to cope with high-frequency EMI at present. In this shielding structure such that the plug-in units adjacent to each other are in close contact with each other through the gasket, the gasket exerts an elastic force in the lateral direction of each plug-in unit, causing a hindrance to smooth insertion/ejection of each plug-in unit with respect to the shelf.

Further, such a conventional communication apparatus employs a punching metal as a shield board for ensuring EMI resistance and fire resistance. The punching metal has a low opening ratio, so that the air-flow resistance of cooling air for the communication apparatus is high, causing a bottleneck in improving the cooling performance. Moreover, the thickness of the punching metal must be increased to satisfy the cutoff frequency, causing an increase in weight. Further, it is necessary to ensure the reliability of connection between each plug-in unit and the back wiring board in applying connectors for ultrafast transmission. A conventional lever for use in plug-in connection of the connectors of each plug-in unit and the back wiring board is limited in its engagement accuracy. In particular, a connector with a short engagement length under development for ultrahigh frequencies cannot ensure a sufficient connection reliability. Accordingly, any additional fixing means such as a screw must be provided to sufficiently engage the connectors by the use of the conventional lever.

It is apparent that the traffic and transmission speed in the future communication field will be increased. In relation thereto, the housing structure of the conventional communication apparatus is unsatisfactory in the following points.

(1) EMI resistance in ultrafast transmission
(2) Reliability of connection between each plug-in unit and the back wiring board in applying the connectors for ultrafast transmission
(3) Cooling performance for suppression of heating due to an increase in power consumption
(4) Fire resistance
(5) High-density mount capable of supporting an increase in number of cable interfaces Accordingly, for realization of ultrafast transmission, it is necessary to ensure sufficient EMI resistance and fire resistance, to improve the cooling performance, and to mount heating components at a high density. Thus, these theoretically conflicting conditions must be satisfied.

SUMMARY OF THE INVENTION

It is therefore an object of the present invention to provide a communication apparatus which can ensure sufficient EMI resistance and cooling performance and can mount heating components at a high density.

In accordance with an aspect of the present invention, there is provided a communication apparatus increasing a shelf formed of metal, the shelf having a pair of side plates; a back wiring board mounted in the shelf on the back side thereof, the back wiring board having a plurality of first connectors and a solid ground pattern; an upper guide plate mounted in the shelf on the upper side thereof, the upper guide plate having a plurality of guide rails and a plurality of vent holes; a first shield board mounted on the upper guide plate, the first shield board having numerous openings; a lower guide plate mounted in the shelf on the lower side thereof, the lower guide plate having a plurality of guide rails and a plurality of vent holes; a second shield board mounted on the lower guide plate, the second shield board having numerous openings; a plurality of plug-in units mounted in the shelf so as to be inserted along the guide rails of the upper guide plate and the guide rails of the lower guide plate, each of the plug-in units having a printed wiring board, a second connector mounted on the printed wiring board and connected to one of the first connectors, a front structure fixed to the front end of the printed wiring board, the front structure having an upper surface, a pair of side surfaces, and a lower surface, and a first conductive gasket continuously mounted on the upper surface, one of the side surfaces, and the lower surface of the front structure; and a second conductive gasket mounted on one of the side plates of the shelf; the second conductive gasket being in close contact with the front structure of one of the plug-in units adjacent to the one side plate of the shelf, the first conductive gasket of the one plug-in unit being in close contact with the front structure of another one of the plug-in units adjacent to the one plug-in unit or in close contact with the other side plate of the shelf, thereby realizing electromagnetic shield on the front side of the shelf; the first shield board realizing electromagnetic shield on the upper side of the shelf; the second shield board realizing electromagnetic shield on the lower side of the shelf; the ground pattern of the back wiring board realizing electromagnetic shield on the back side of the shelf; the side plates of the shelf realizing electromagnetic shield on the right and left sides of the shelf.

The communication apparatus further includes an external cable inserted in the front structure of each plug-in unit; the front structure of each plug-in unit having a shielded external cable introducing portion for introducing the external cable to the printed wiring board. The communication apparatus further increases an upper strike plate mounted on the front side of the upper guide plate; and a lower strike plate mounted on the front side of the lower guide plate.

Preferably, the upper surface of the front structure of each plug-in unit has a first projection; the lower surface of the front structure of each plug-in unit has a second projection; the upper strike plate has a plurality of recesses for respectively engaging the first projections of the plug-in units; and the lower strike plate has a plurality of recesses for respectively engaging the second projections of the plug-in units. Preferably, the recesses of the upper strike plate increase a plurality of guide rails respectively aligned with the guide rails of the upper guide plate; and said recesses of the lower strike plate increase a plurality of guide rails respectively aligned with the guide rails of the lower guide plate. Alternatively, the upper surface of the front structure of each plug-in unit may have a first recess; the lower surface of the front structure of each plug-in unit may have a second recess; the upper strike plate may have a plurality of projections for respectively engaging the first recesses of the plug-in units; and the lower strike plate may have a plurality of projections for respectively engaging the second recesses of the plug-in units.

With this configuration, the plug-in units vertically mounted in the shelf are fixed by the engagement of the first connectors of the back wiring board and the second connectors of the plug-in units on the back side of the shelf and by the engagement of the projections or recesses of the plug-in units and the recesses or projections of the upper and lower strike plates on the front side of the shelf. Accordingly, although the gaskets of the adjacent plug-in units exert elastic forces in the lateral direction, the elastic forces can be absorbed to some extent by the engagement of the projections and the recesses on the front side of the shelf, so that the insertion/ejection of the plug-in units are not hindered by the elastic forces.

Preferably, each of the first and second shield boards increases a honeycomb shield board having numerous honeycomb-shaped openings. Preferably, the front structure of each plug-in unit has a pair of upper and lower levers pivotably mounted at upper and lower end portions, each of the levers having a first engaging portion and a second engaging portion; the upper strike plate having a groove for engaging the first engaging portion of the upper lever; the lower strike plate having a groove for engaging the first engaging portion of the lower lever.

Preferably, the upper guide plate has a plurality of first elastic lock members respectively corresponding to the plug-in units and biased downward; the lower guide plate has a plurality of second elastic lock members respectively corresponding to the plug-in units and biased upward; and the printed wiring board of each plug-in unit has a first notch for engaging the corresponding first elastic lock member and a second notch for engaging the corresponding second elastic lock member. Preferably, the front structure of each plug-in unit has a first unlocking mechanism for disengaging the corresponding first elastic lock member from the first notch, and a second unlocking mechanism for disengaging the corresponding second elastic lock member from the second notch.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 15 is a perspective view of the honeycomb shield board mounted on the upper guide plate;

DETAILED DESCRIPTION OF THE PREFERRED EMBODIMENTS

Figure 1:
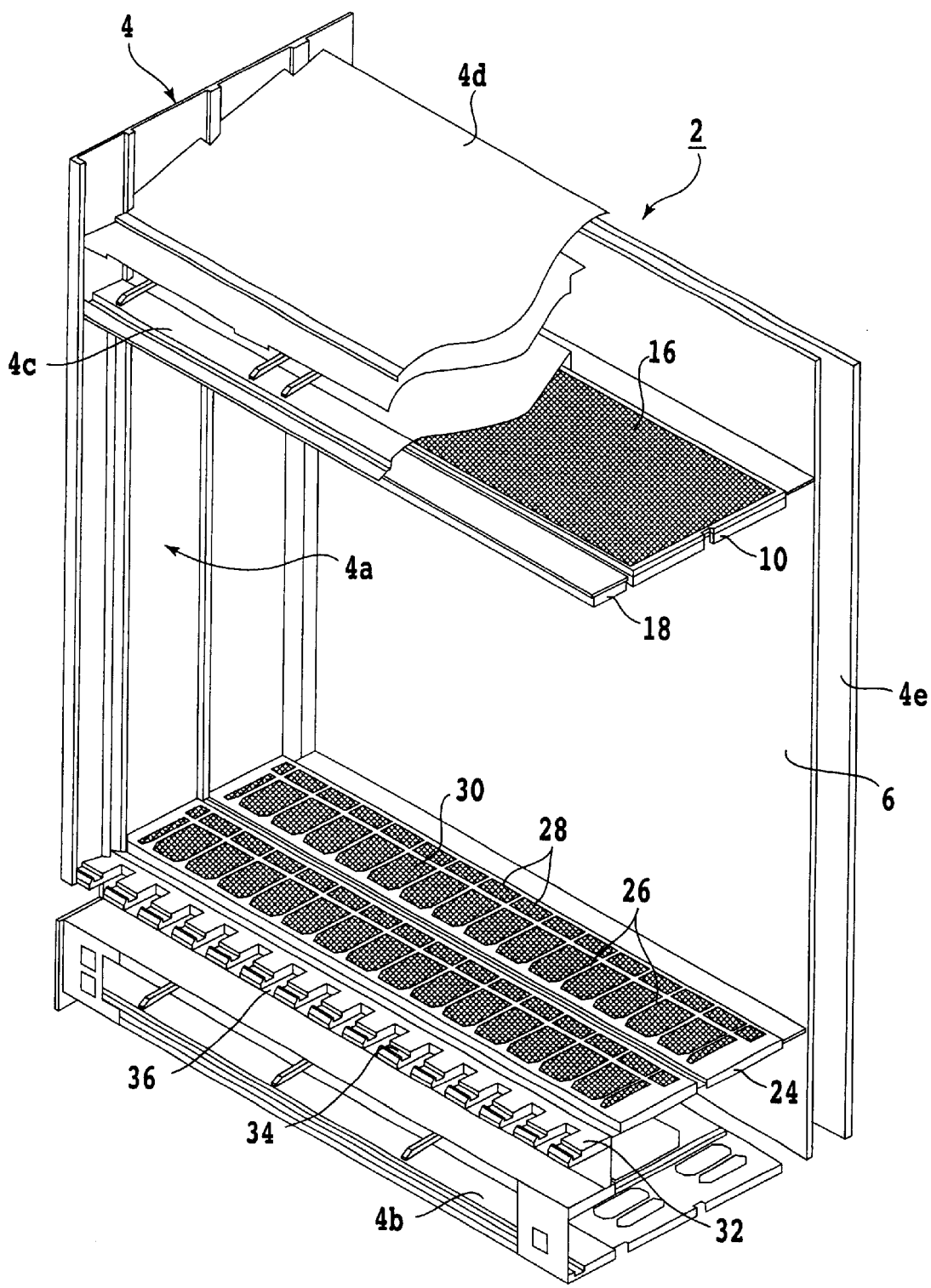
FIG. 1 is a perspective view of a preferred embodiment of the present invention.
Figure 2:
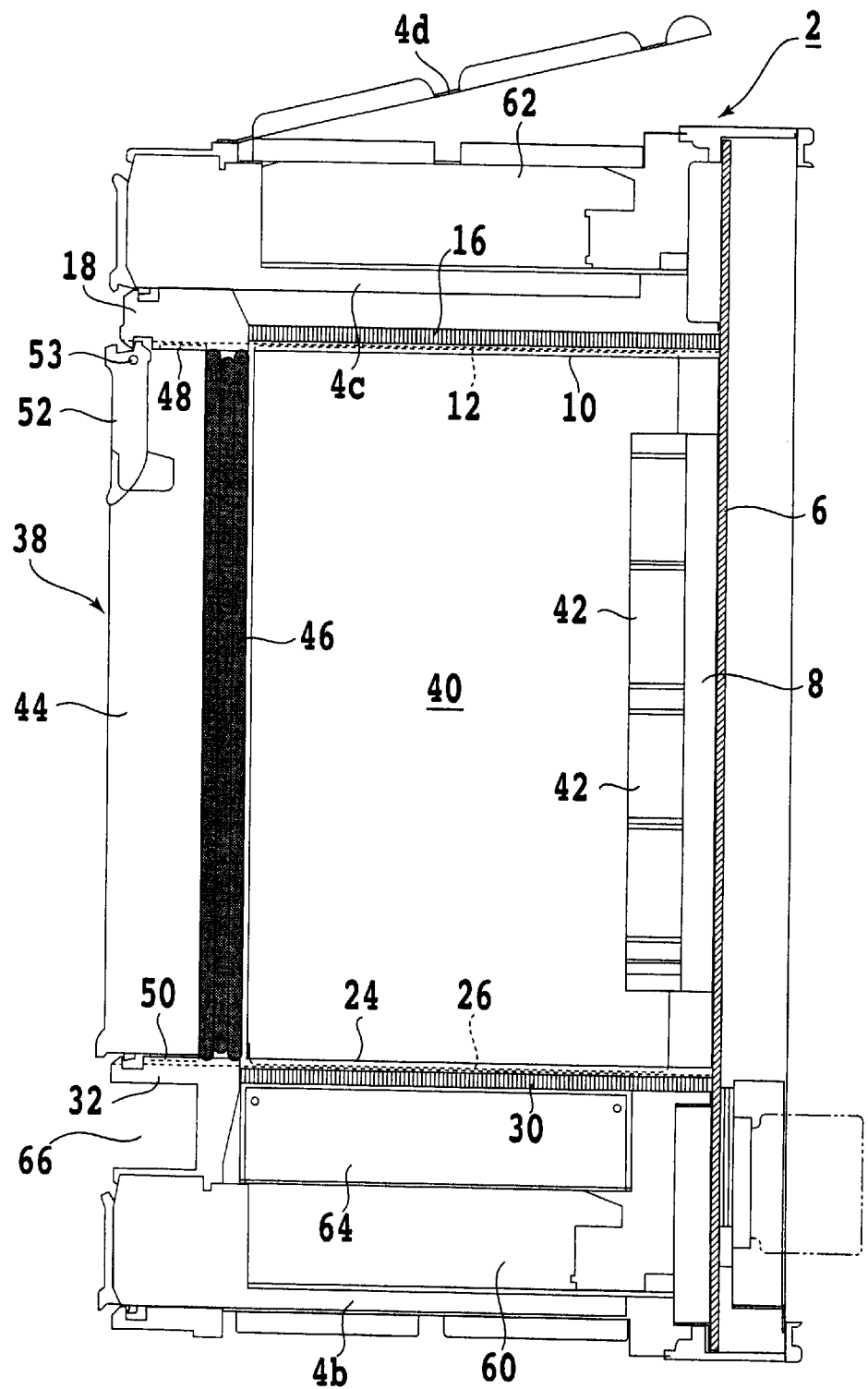
FIG. 2 is a sectional side view of the preferred embodiment.

A preferred embodiment of the present invention will now be described in detail with reference to the drawings. FIG. 1 is a partially cutaway, perspective view of a communication apparatus 2 such as a transmission device according to a preferred embodiment of the present invention, and FIG. 2 is a sectional side view of the communication apparatus 2. As shown in FIG. 2, the communication apparatus 2 includes a shelf 4 formed of metal and a plurality of plug-in units (PIU) 38 vertically mounted in the shelf 4. In FIG. 1, the plug-in units 38 are not shown. The shelf 4 has a pair of side plates 4a, a bottom plate 4b, a fan supporting plate 4c, a top plate 4d inclined so as to be raised on the back side, and a back plate 4e.

Figure 3:
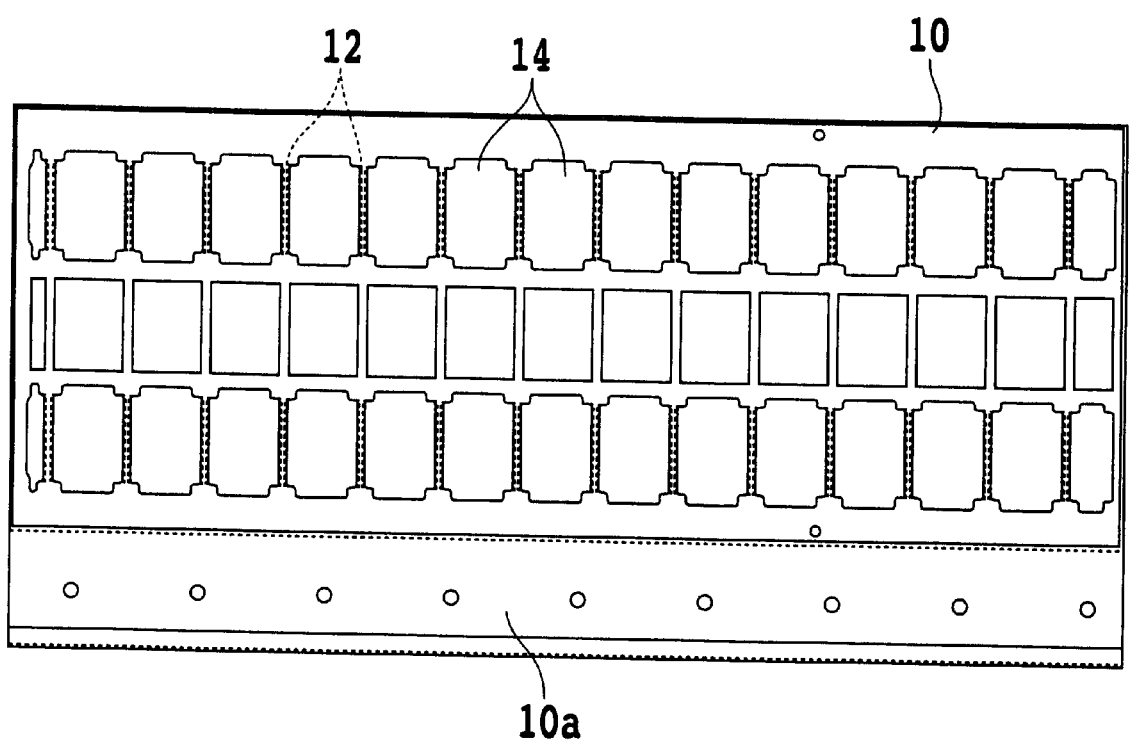
FIG. 3 is a plan view of an upper guide plate.
Figure 4:
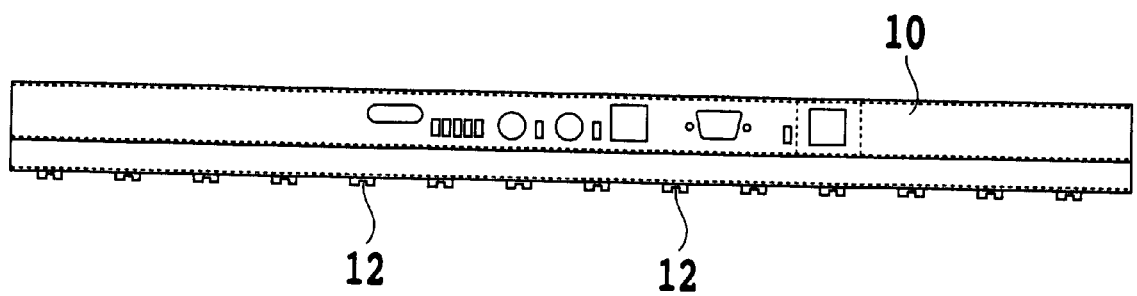
FIG. 4 is an elevational view of FIG. 3.
Figure 5:
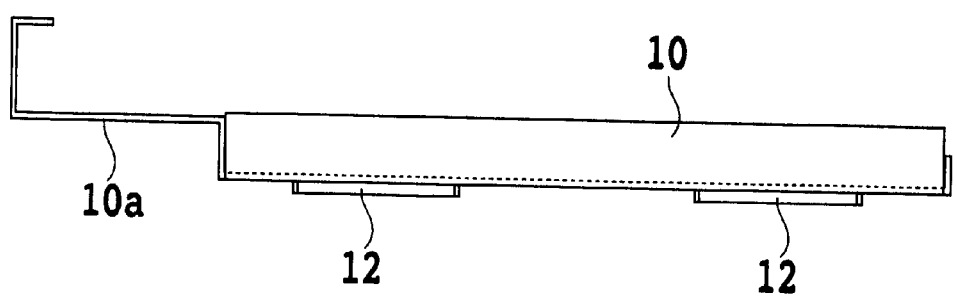
FIG. 5 is a right side view of FIG. 3.

A back wiring board (BWB) 6 having a plurality of connectors 8 is mounted in the shelf 4 on the back side thereof. Reference numeral 10 denotes an upper guide plate, and the details thereof are shown in FIGS. 3 to 5. As best shown in FIG. 3, the upper guide plate 10 has a plurality of guide rails 12 and a plurality of vent holes 14. The upper guide plate 10 is provided at its front end with a strike plate mounting portion 10a.

Figure 6A:
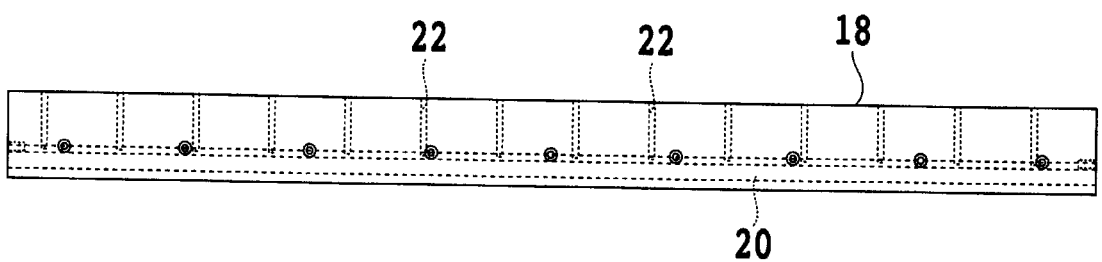
FIG. 6A is a plan view of an upper strike plate.
Figure 6B:
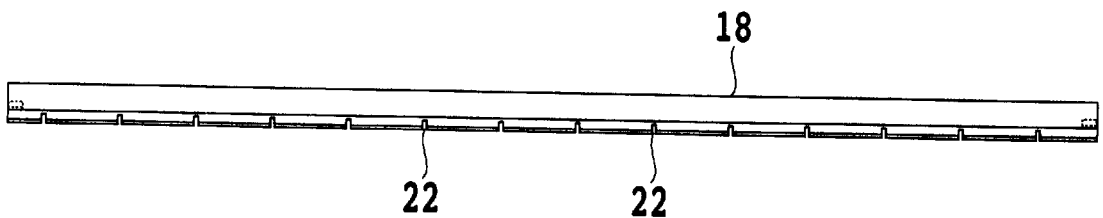
FIG. 6B is an elevational view of FIG. 6A.

A strike plate 18 is fixed to the strike plate mounting portion 10a of the upper guide plate 10 on the lower side thereof by screws. As shown in FIGS. 6A and 6B, the strike plate 18 has a groove 20 for engaging a lever of each plug-in unit 38 for use in inserting and ejecting the plug-in unit 38 to be hereinafter described in detail, and a plurality of guide rails 22 respectively aligned with the guide rails 12 of the upper guide plate 10. A shield board 16 having numerous openings is mounted on the upper surface of the upper guide plate 10. The shield board 16 is provided by a honeycomb shield board having numerous honeycomb-shaped openings as will be hereinafter described in detail.

Reference numeral 24 denotes a lower guide plate. Like the upper guide plate 10, the lower guide plate 24 has a plurality of guide rails 26 and a plurality of vent holes 28. A honeycomb shield board 30 having numerous honeycomb-shaped openings is fixed to the lower surface of the lower guide plate 24. A strike plate 32 is mounted on a front end portion of the lower guide plate 24. The strike plate 32 has a groove 34 for engaging another lever of each plug in unit 38 for use in inserting and ejecting the plug-in unit 38, and a plurality of recesses 36 for allowing the pass of external cables to be hereinafter described. The strike plate 32 further has a plurality of guide rails (not shown) respectively aligned with the guide rails 26 of the lower guide plate 24.

Figure 7:
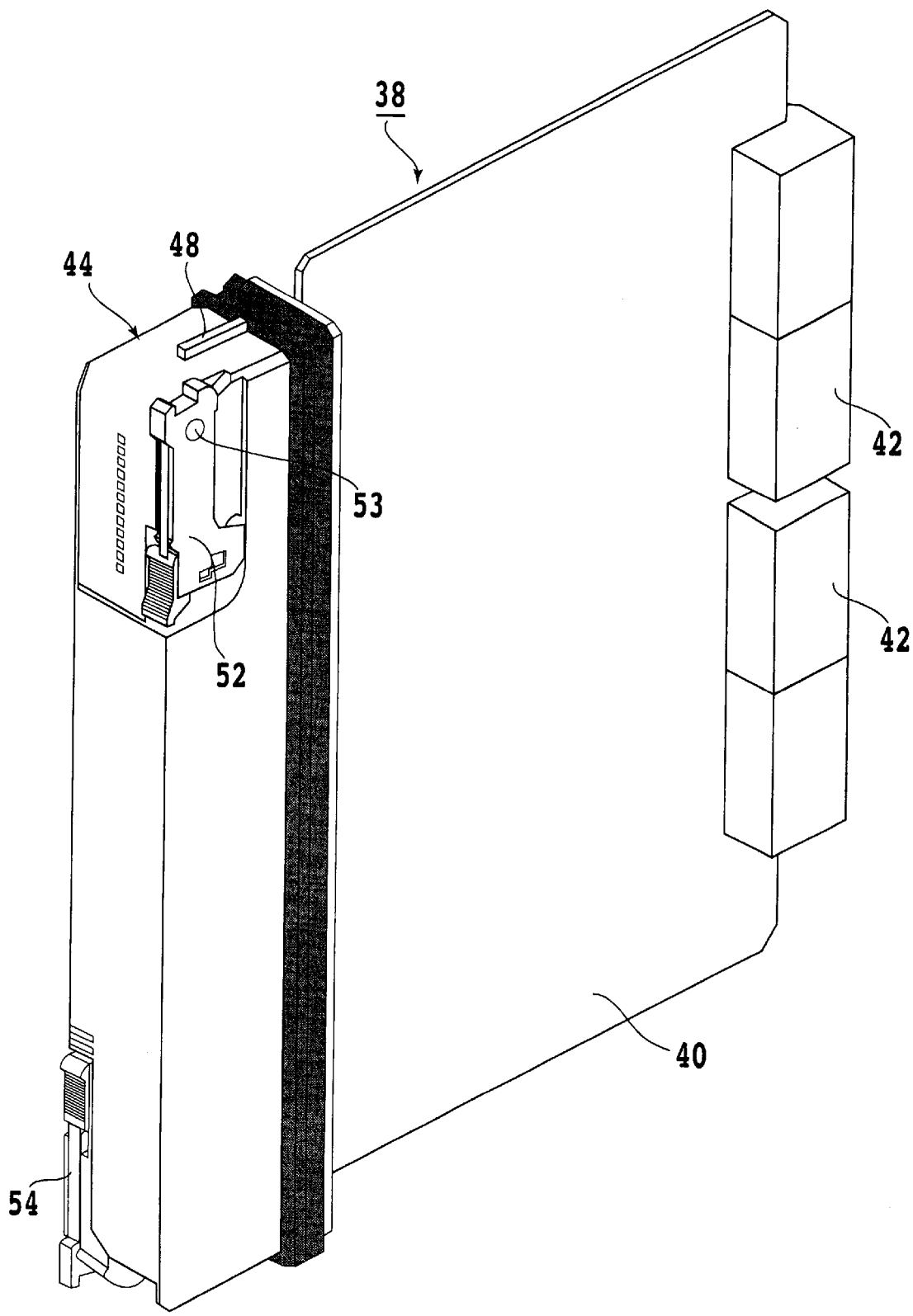
FIG. 7 is a perspective view of a plug-in unit.
Figure 8:
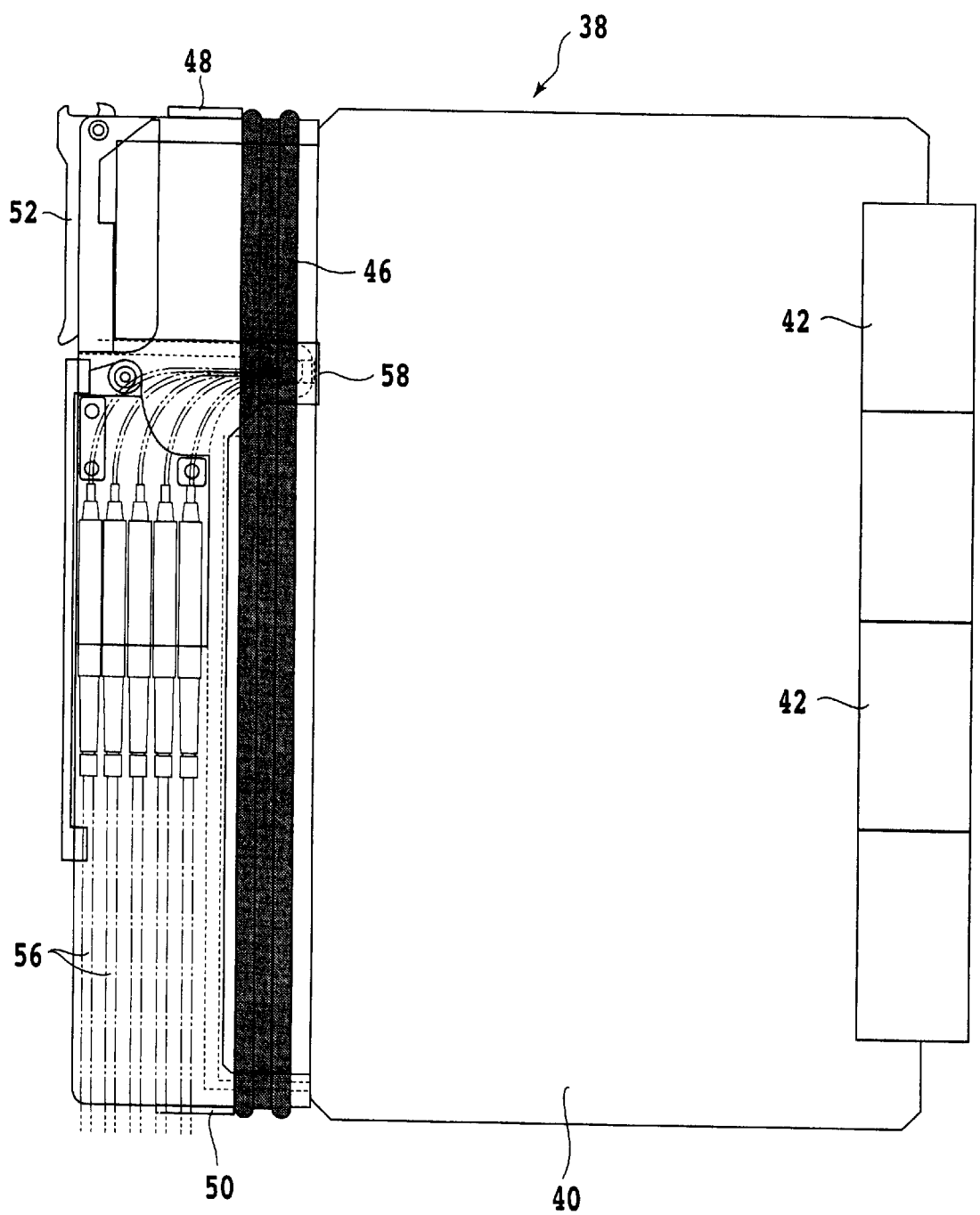
FIG. 8 is a partially transparent, side view of the plug-in unit.
Figure 9:
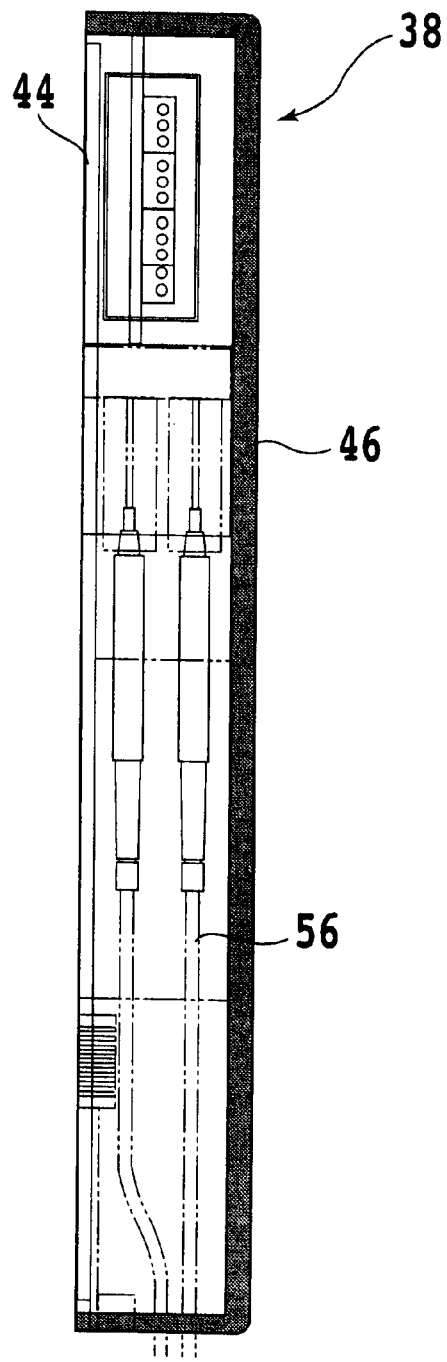
FIG. 9 is a transparent elevational view of the plug-in unit.

Referring to FIG. 7, there is shown a perspective view of each plug-in unit 38. FIG. 8 is a partially transparent, side view of the plug-in unit 38 shown in FIG. 7, and FIG. 9 is a transparent elevational view of the plug-in unit 38 shown in FIG. 7. Each plug-in unit 38 has a printed wiring board 40 on which a plurality of electronic components (not shown) are mounted, a plurality of connectors 42 adapted to be connected to the connectors 8 of the back wiring board 6, and a front structure 44 fixed to the front end of the printed wiring board 40.

Figure 28:
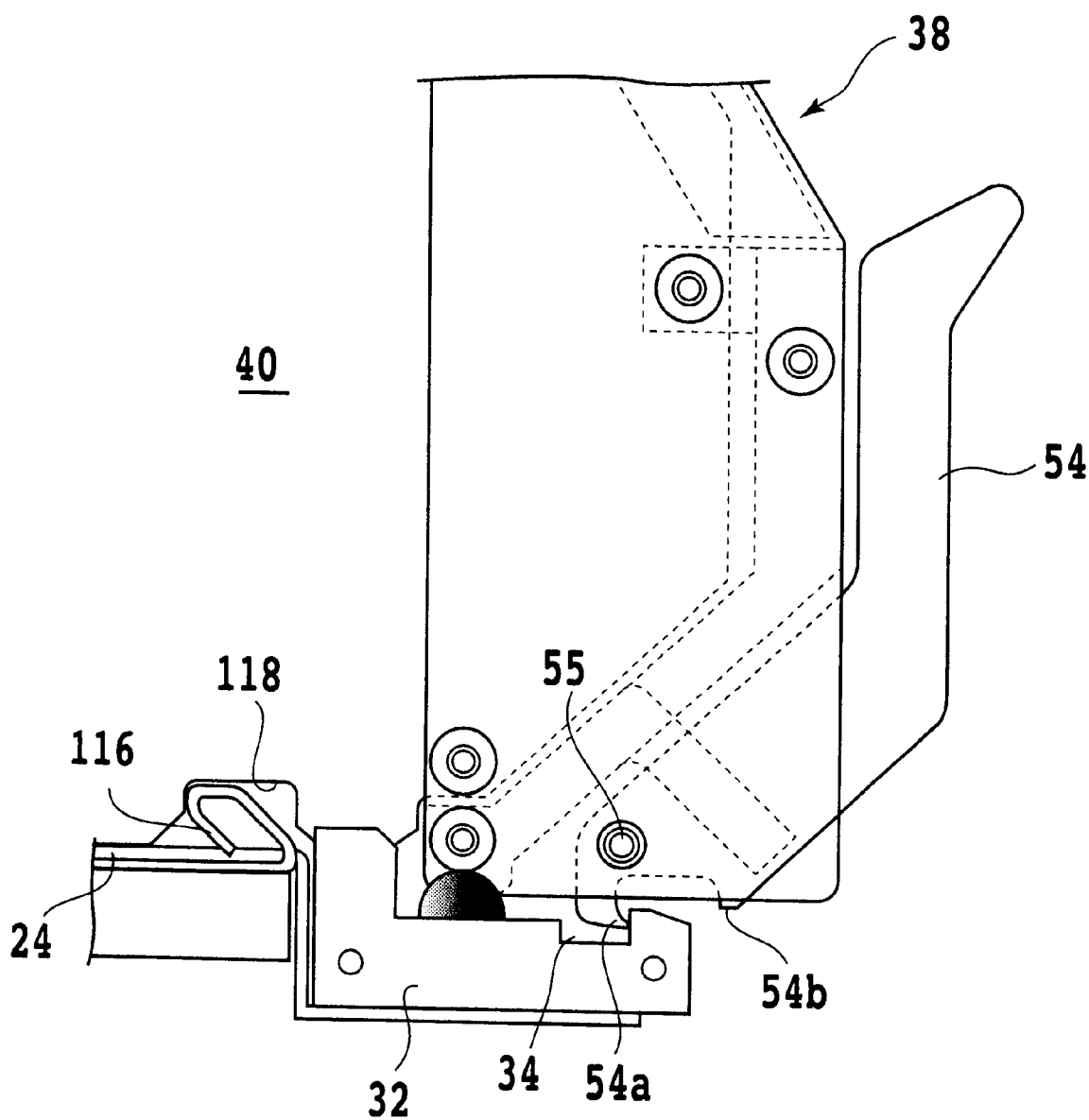
FIG. 28 is a side view of an insertion/ejection mechanism for each plug-in unit.

A conductive gasket 46 is continuously mounted on the upper surface, one of the opposite side surfaces, and the lower surface of the front structure 44. Projections 48 and 50 are provided on the upper and lower surfaces of the front structure 44, respectively. Levers 52 and 54 for insertion/ejection of the plug-in unit 38 are pivotably mounted through shafts 53 and 55 to the upper and lower end portions of the front structure 44, respectively. The shaft 55 is shown in FIG. 28. As shown in FIGS. 8 and 9, a plurality of external cables (optical fiber cables) 56 are stored in the front structure 44. The external cables 56 are introduced through a shielded external cable introducing portion 58 to component mounted regions of the printed wiring board 40.

The external cable introducing portion 58 is managed by a high-cutoff frequency fc (Hz) shown below.

$$fc = 175.26/d \times 10^9 \quad (1)$$

where d is the diameter (mm) of an opening.

In the condition where the plug-in unit 38 is inserted in the shelf 4 and the connectors 42 of the plug-in unit 38 are engaged with the connectors 8 of the back wiring board 6 as shown in FIG. 2, the external cables 56 extending from the lower end of the front structure 44 of the plug-in unit 38 are passed through the corresponding recess 36 of the strike plate 32 shown in FIG. 1.

Referring back to FIG. 2, a lower fan 60 is mounted on the bottom plate 4b of the shelf 4, and an upper fan 62 is mounted on the fan supporting plate 4c of the shelf 4. The communication apparatus 2 in this preferred embodiment adopts a push-pull cooling system using the fans 60 and 62 respectively mounted in the lower and upper end portions of the shelf 4. An air chamber 64 is provided above the fan 60, and a cable duct 66 for accommodating the external cables 56 extending from the plug-in units 38 vertically mounted in the shelf 4 is provided below the strike plate 32.

Figure 10:
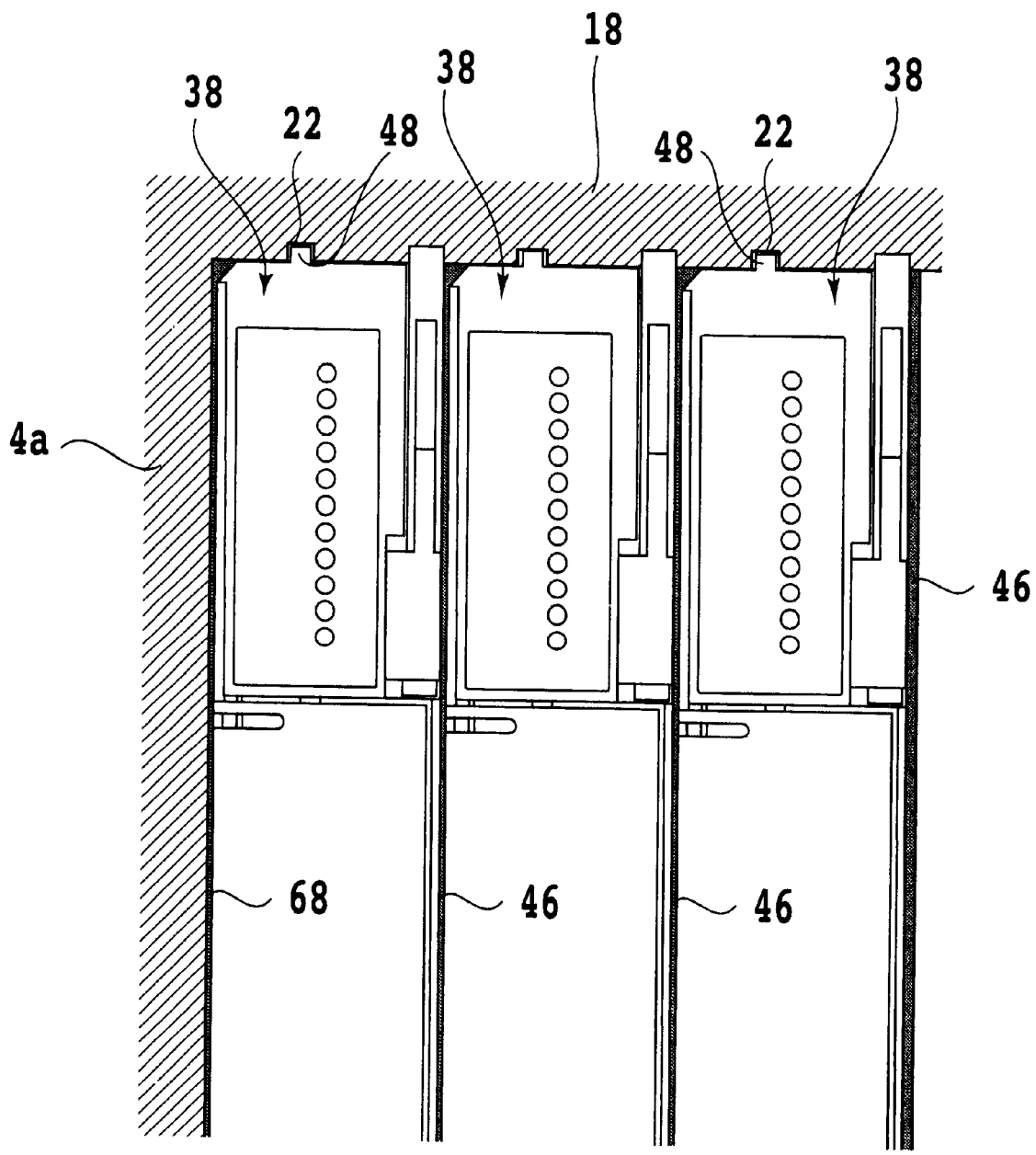
FIG. 10 is an enlarged elevational view showing the engagement of projections of the plug-in units and recesses of the upper strike plate.
Figure 11:
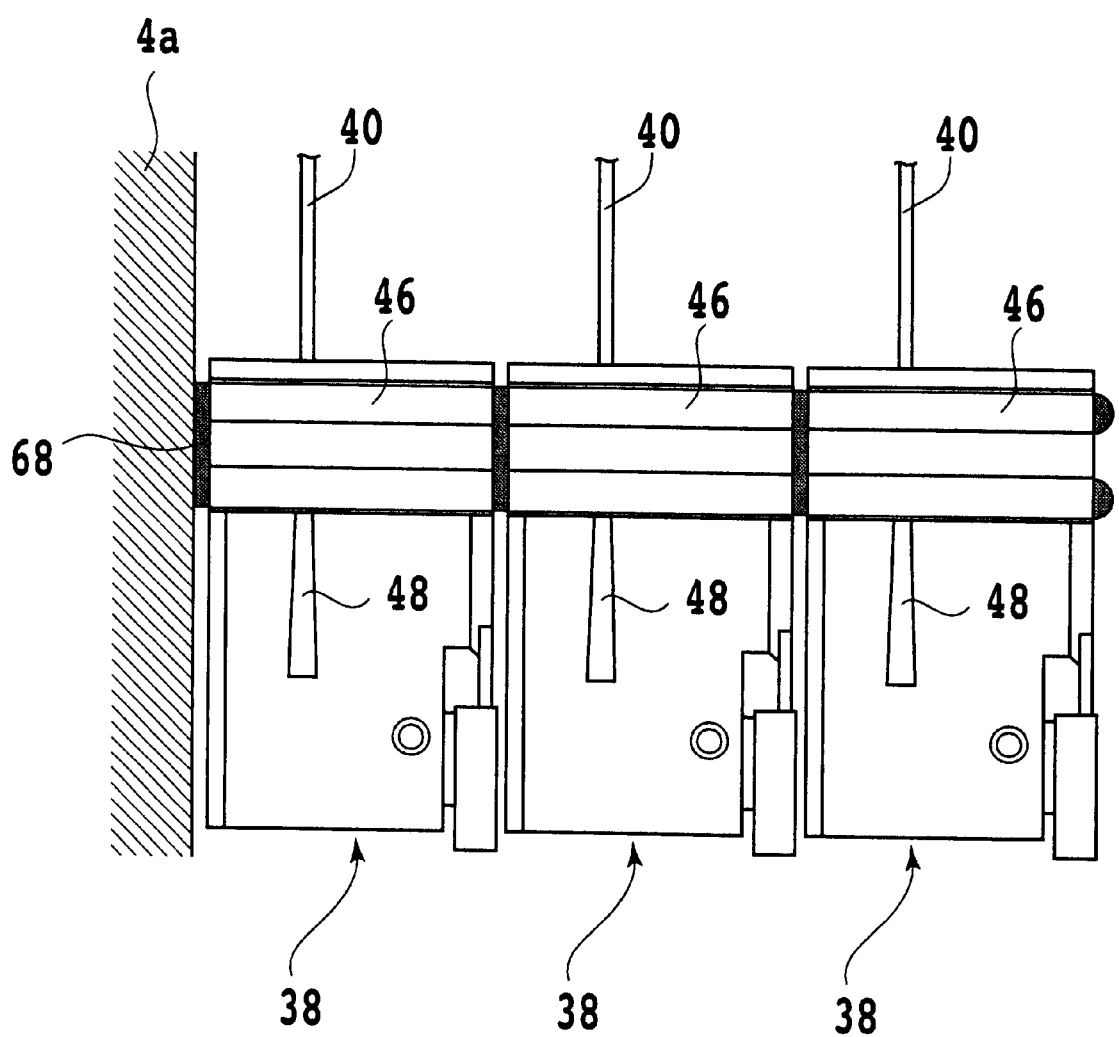
FIG. 11 is a plan view of FIG. 10.
Figure 12:
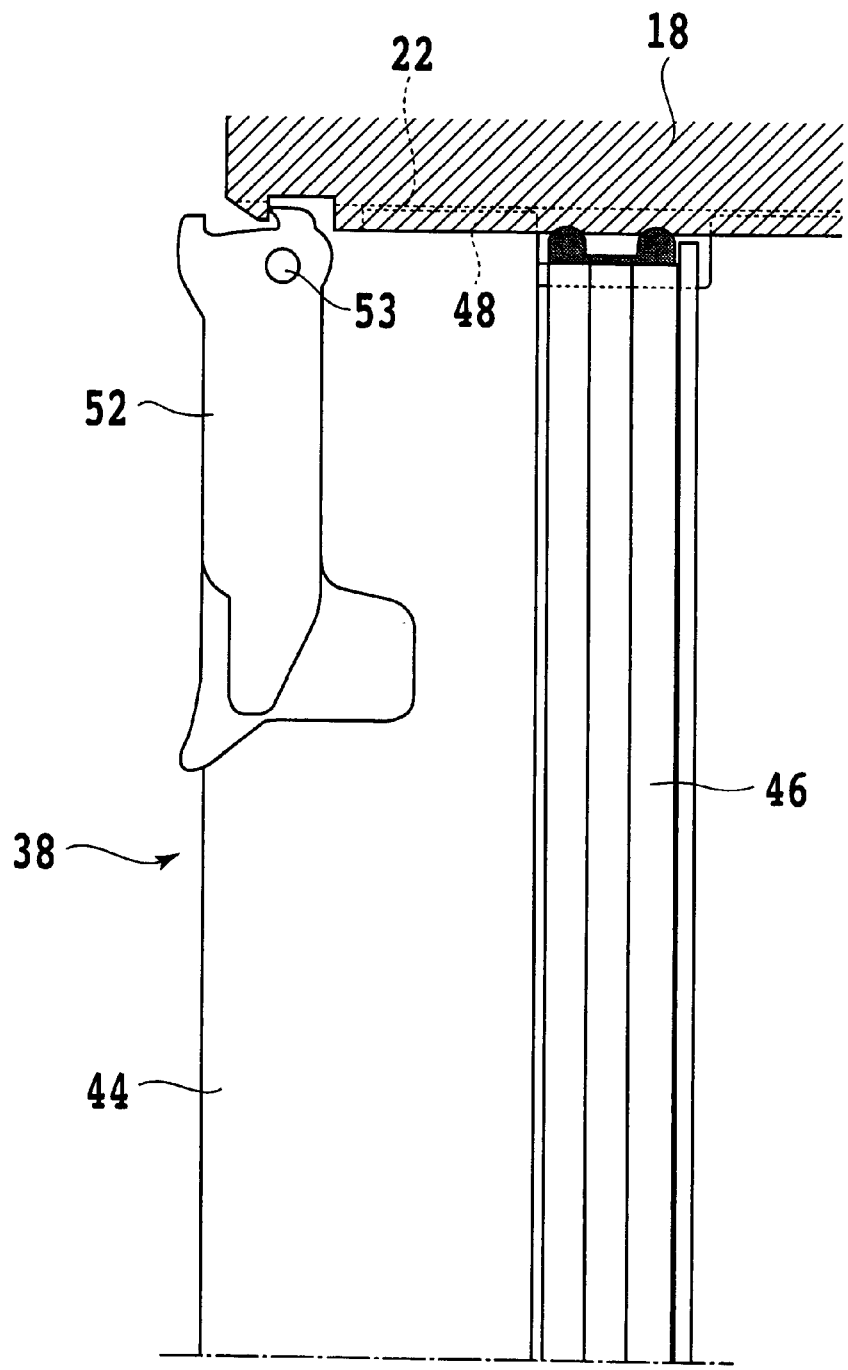
FIG. 12 is a right side view of FIG. 10.

When each plug-in unit 38 is fully inserted in the shelf 4, the connectors 42 of the plug-in unit 38 are engaged with the connectors 8 of the back wiring board 6, and the projections 48 and 50 of the front structure 44 of the plug-in unit 38 are engaged with the corresponding recesses of the upper and lower strike plates 18 and 32, respectively. FIG. 10 is an elevational view showing a condition where the projection 48 of each plug-in unit 38 is engaged with the corresponding recess 22 of the upper strike plate 18. FIG. 11 is a plan view of FIG. 10, and FIG. 12 is a right side view of FIG. 10. In this preferred embodiment, the guide rails 22 of the upper strike plate 18 function as the recesses for engaging the projections 48 of the plug-in units 38. Similarly, the guide rails of the lower strike plate 32 function as the recesses for engaging the projections 50 of the plug-in units 38.

Reference numeral 68 denotes a conductive gasket mounted on one of the side plates 4a of the shelf 4. The conductive gasket 68 is positioned so as to come into close contact with the side surface of the front structure 44 of the plug-in unit 38 on which the conductive gasket 46 is not mounted. Accordingly, in the fully inserted condition of the plug-in units 38 in the shelf 4 as shown in FIGS. 10 and 11, the gasket 68 mounted on the left side plate 4a of the shelf 4 is in close contact with the left side surface of the front structure 44 of the first plug-in unit 38 adjacent to the left side plate 4a, and the gasket 46 mounted on the right side surface of the front structure 44 of the first plug-in unit 38 is in close contact with the left side surface of the front structure 44 of the second plug-in unit 38 adjacent to the first plug-in unit 38. Similarly, the other adjacent plug-in units 38 are close contact with each other through the gaskets 46. In inserting the plug-in units 38 into the shelf 4, the gaskets 68 and 46 exert lateral elastic forces to possibly cause the lateral shift of the front structure 44 of each plug-in unit 38. However, the projection 48 of the front structure 44 of each plug-in unit 38 comes into engagement with the recess 22 of the strike plate 18, thereby preventing the lateral shift of the front structure 44 of each plug-in unit 38. Similarly, the projection 50 of the front structure 44 of each plug-in unit 38 comes into engagement with the recess of the strike plate 32, thereby preventing the above lateral shift. Accordingly, each plug-in unit 38 can be smoothly inserted and ejected.

Figure 13:
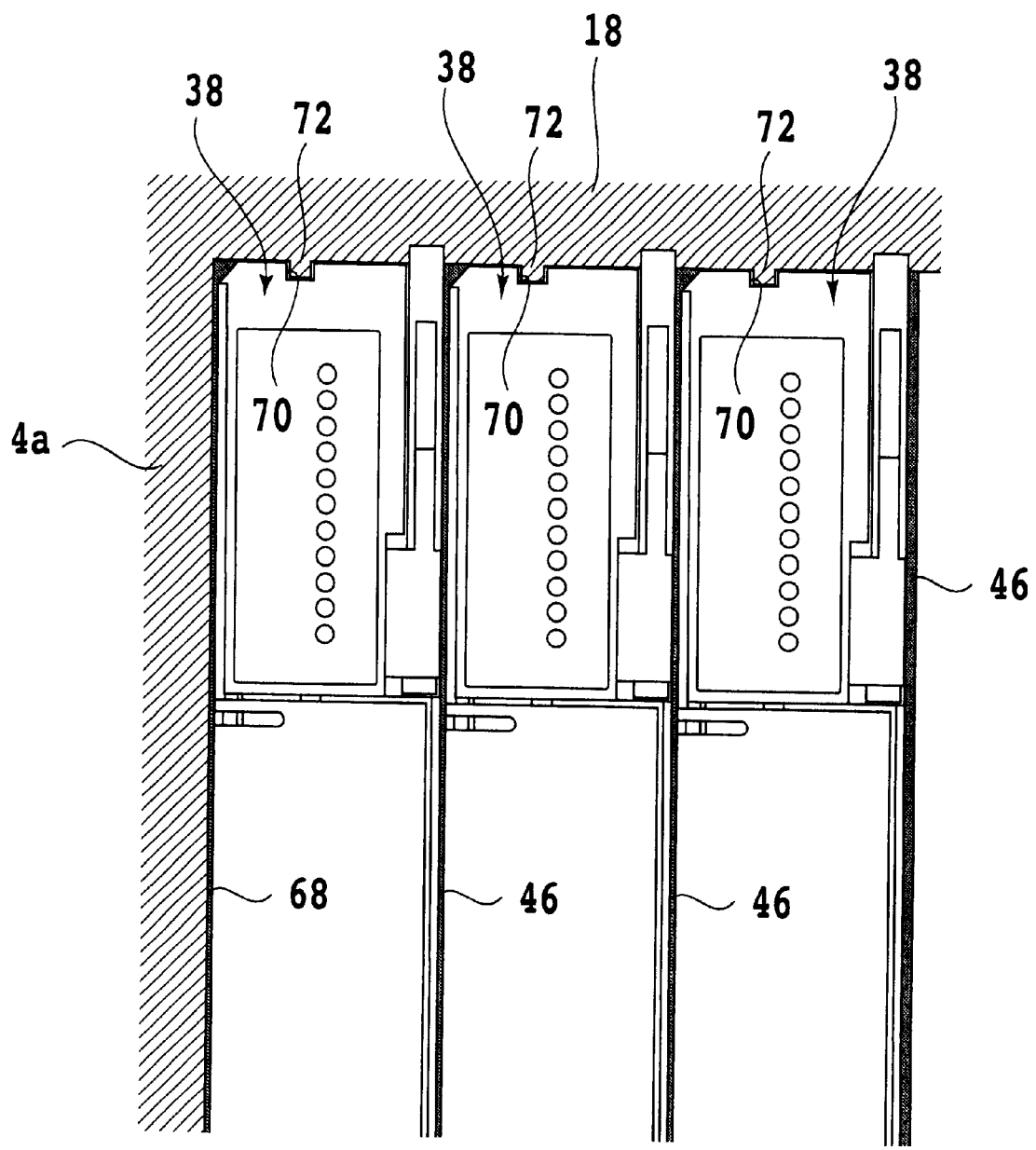
FIG. 13 is an enlarged elevational view showing the engagement of recesses of the plug-in units and projections of the upper strike plate as a modification.

Each plug-in unit 38 is positioned on the back side of the shelf 4 by the engagement of the connectors 42 with the connectors 8 of the back wiring board 6, and is further positioned on the front side of the shelf 4 by the engagement of the projection 48 with the corresponding recess 22 of the upper strike plate 18 and by the engagement of the projection 50 with the corresponding recess of the lower strike plate 32. FIG. 13 shows a modification of the configuration shown in FIG. 10. In this modification, the upper surface of the front structure 44 of each plug-in unit 38 is formed with a recess 70, and the upper strike plate 18 is formed with a projection 72 adapted to engage the recess 70. Although not shown, the lower surface of the front surface 44 of each plug-in unit 38 is formed with a recess, and the lower strike plate 32 is formed with a projection adapted to engage this recess of each plug-in unit 38.

Figure 14:
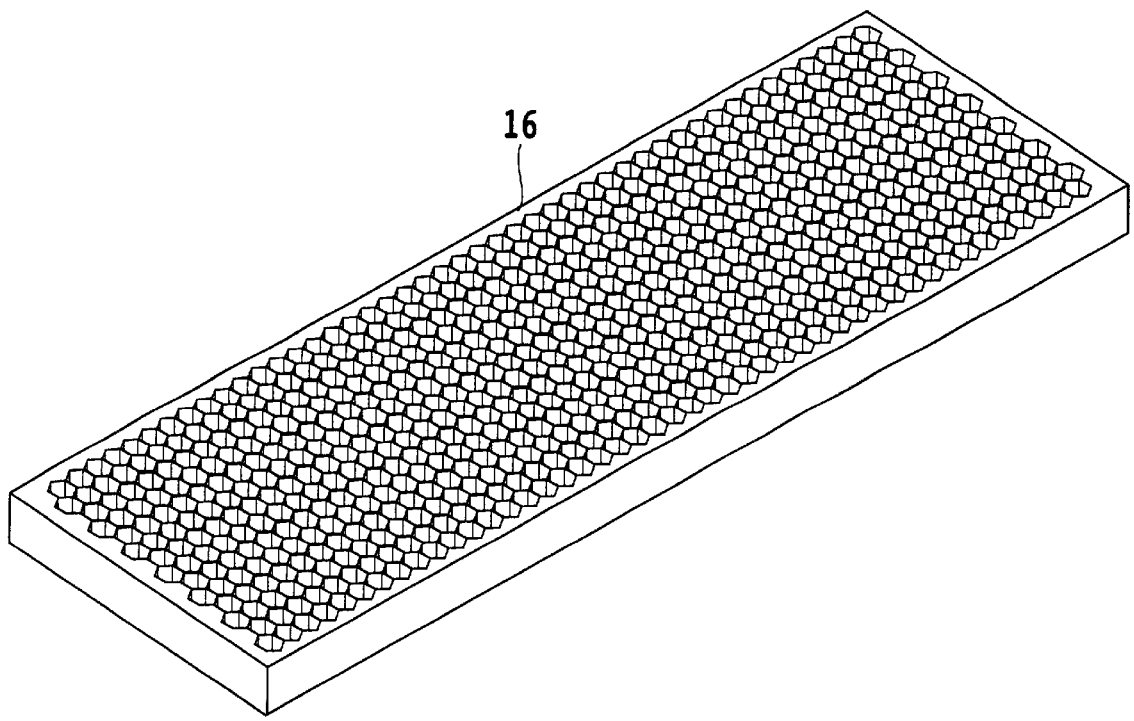
FIG. 14 is a perspective view of a honeycomb shield board.

FIG. 14 is a perspective view of the honeycomb shield board 16. The honeycomb shield board 16 is formed of aluminum, for example, and it is manufactured by a conventional aluminum honeycomb manufacturing process. More specifically, this process includes the steps of stacking a plurality of aluminum foils washed and surface-treated, and selectively applying a pressure to a portion to be bonded as heating at a high temperature, thereby bonding the stacked aluminum foils at the selected portion by diffusion bonding of metals to form a block.

This block is next cut into slices each having a width of about 6 mm, and each slice is expanded to manufacture the honeycomb shield board 16. The honeycomb shield board 16 has numerous openings each having a diameter of about 3 to 4 mm, and the thickness of the shield board 16 is about 6 mm. The honeycomb shield board 16 is managed by the cutoff frequency fc specified by Eq. (1). According to the honeycomb shield board 16, a high frequency of 40 GHz can be attenuated by 20 dB.

Figure 16A:
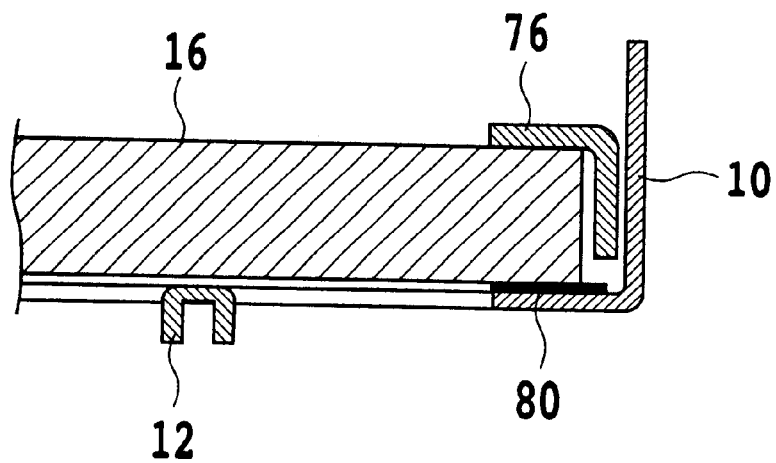
FIG. 16A is a cross section taken along the line 16A—16A in FIG. 15.
Figure 16B:
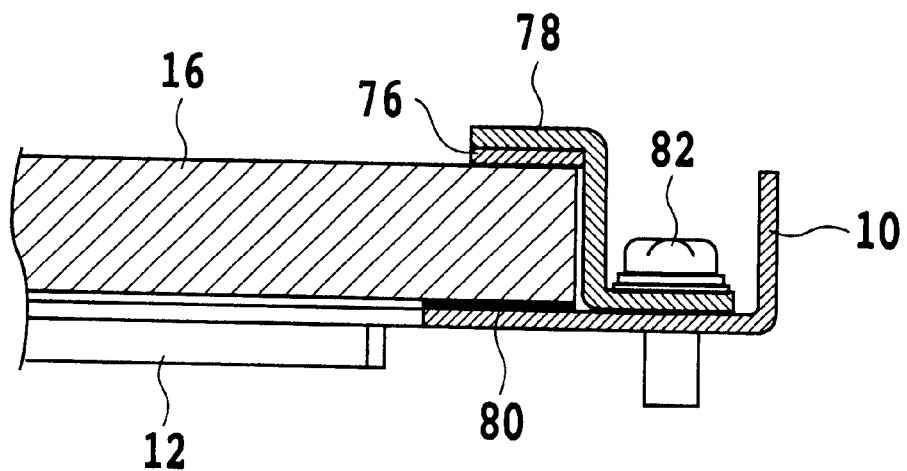
FIG. 16B is a cross section taken along the line 16B—6B in FIG. 15.

FIG. 15 is a perspective view of the honeycomb shield board 16 mounted on the upper guide plate 10. FIG. 16A is a cross section taken along the line 16A—16A in FIG. 15, and FIG. 16B is a cross section taken along the line 16B—16B in FIG. 15. As shown in FIGS. 16A and 16B, a metal mesh 80 is bonded to the upper guide plate 10, and the honeycomb shield board 16 is placed on the metal mesh 80. The metal mesh 80 is provided to prevent the honeycomb shield board 16 from falling from the upper guide plate 10. Brackets 76 are mounted on the honeycomb shield board 16 along its four sides, and brackets 78 are fastened by screws 82 to the upper guide plate 10 so as to press down the brackets 76, thus fixedly mounting the honeycomb shield board 16 to the upper guide plate 10.

Figure 17:
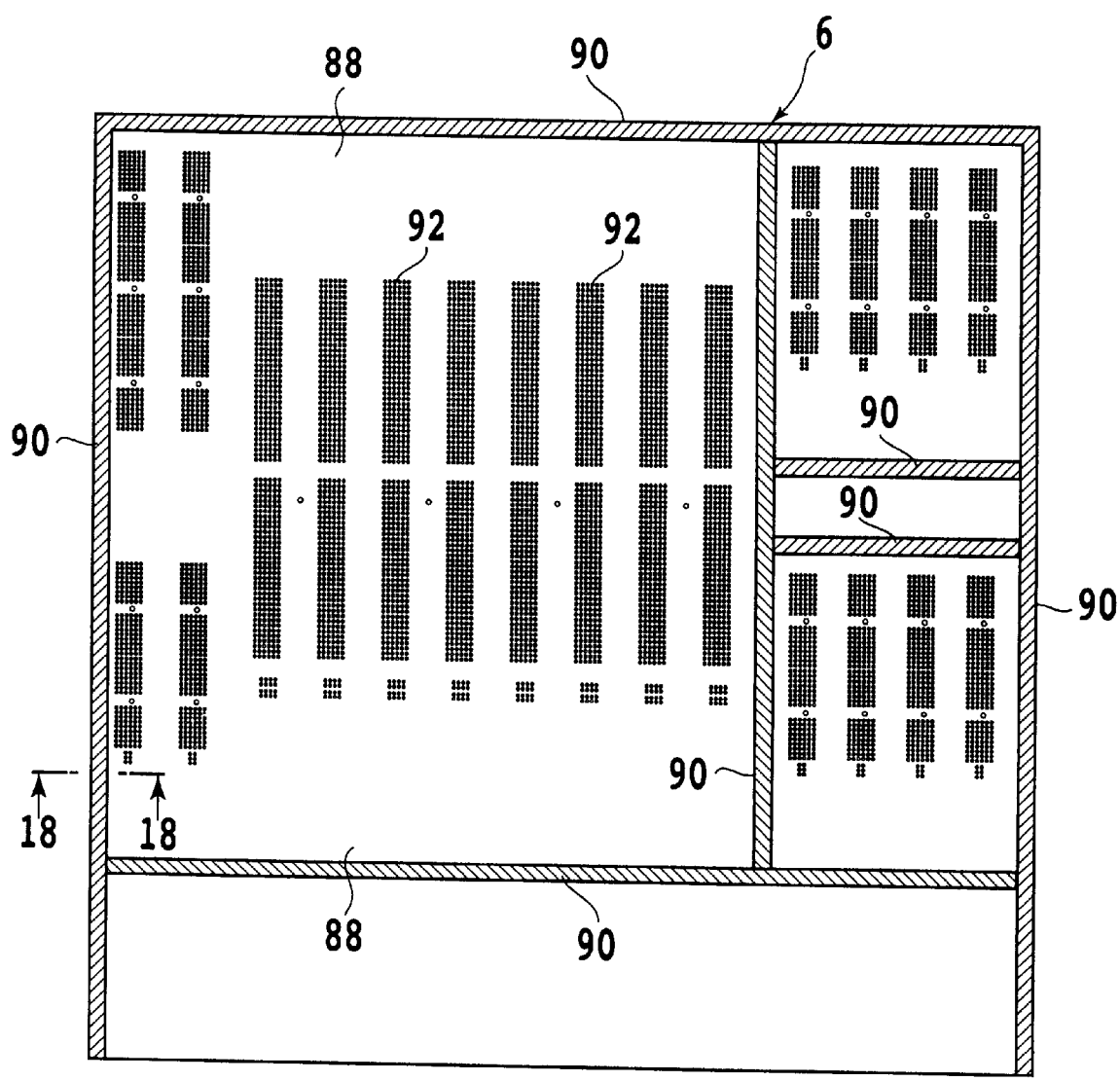
FIG. 17 is an elevational view of a back wiring board.
Figure 18:
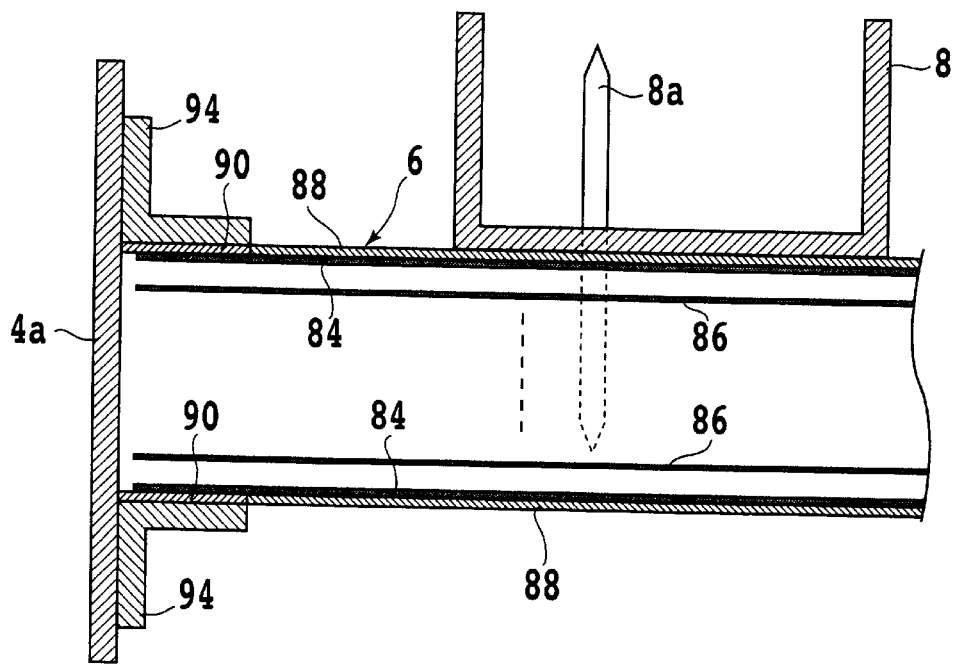
FIG. 18 is a cross section taken along the line 18—18 in FIG. 17.

Referring to FIG. 17, there is shown an elevational view of the back wiring board 6. FIG. 18 is a cross section taken along the line 18—18 in FIG. 17. As shown in FIG. 18, the back wiring board 6 has a plurality of inner-layer patterns 86 and a pair of front and rear ground patterns 84 each formed from a solid copper foil. That is, copper foils are present over the front and rear sides of the back wiring board 6. Each ground pattern 84 is covered with a resist 88 except a hatched portion 90 shown in FIG. 17. That is, each ground pattern 84 is exposed at the hatched portion 90 and plated with a solder.

Reference numerals 92 denote through holes for insertion of press-fit pins 8a. As shown in FIG. 18, the press-fit pins 8a are inserted through the through holes 92 to thereby mount the connectors 8 on the back wiring board 6. The back wiring board 6 is fixed to the side plates 4a of the shelf 4 by means of brackets 94. The ground patterns 84 of the back wiring board 6 are connected to a frame ground (FG). More specifically, the back wiring board 6 is fixed at its right and left solder plating portions 90 to the side plates 4a of the shelf 4, and the upper and lower solder plating patterns 90 are in contact with the upper and lower guide plates 10 and 24, respectively, thereby connecting the shelf 4 and the upper and lower guide plates 10 and 24 to the frame ground.

According to this preferred embodiment, electromagnetic shield on the upper and lower sides of the shelf 4 is realized by the upper and lower shield boards 16 and 30 connected to the frame ground, and electromagnetic shield on the back side of the shelf 4 is realized by the ground patterns 84 of the back wiring board 6. Further, electromagnetic shield on the right and left sides of the shelf 4 is realized by the right and left side plates 4a connected to the frame ground. Further, electromagnetic shield on the front side of the shelf 4 is realized by the close contact of the gasket 68 mounted on one of the side plates 4a and the front structure 44 of one of the plug-in units 38 and by the close contact of the gasket 46 mounted on each plug-in unit 38 and the front structure 44 of the plug-in unit 38 adjacent thereto or another side plate 4a. Accordingly, the inside of the shelf 4 is magnetically completely sealed.

Figure 19:
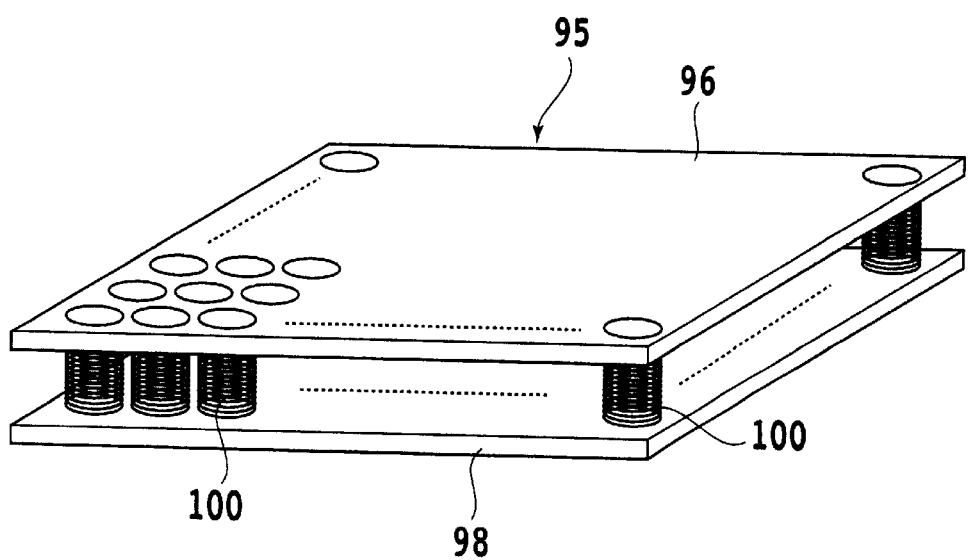
FIG. 19 is a perspective view of another shield board usable in the present invention.
Figure 20A:
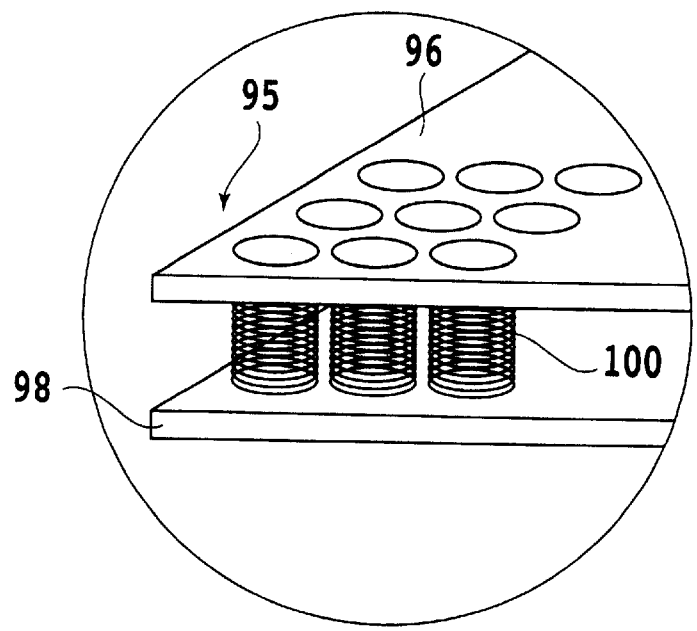
FIG. 20A is an enlarged view of a part of the shield board shown in FIG. 19 in its uncompressed condition.
Figure 20B:
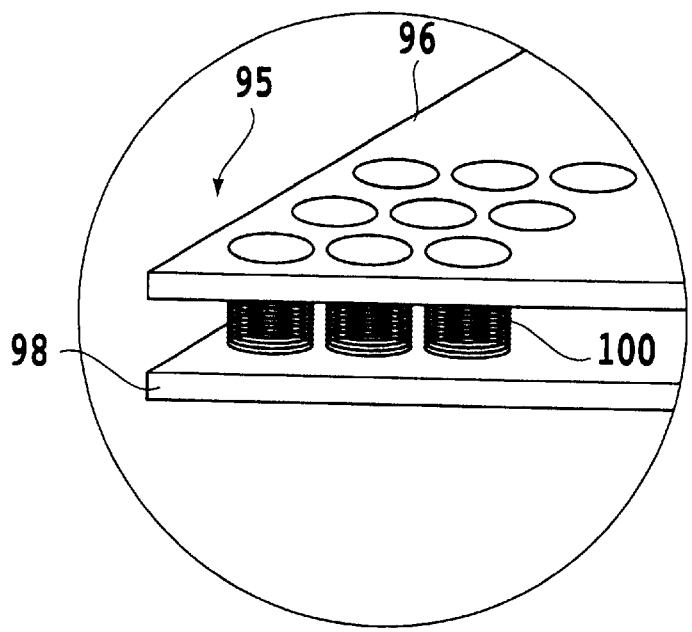
FIG. 20B is a view similar to FIG. 20A, showing a compressed condition.

FIG. 19 is a schematic view of another shield board 95 adoptable in the communication apparatus of the present invention. The shield board 95 includes a pair of punching metals 96 and 98 and a plurality of elastic members 100 such as coil springs interposed between the punching metals 96 and 98. The punching metals 96 and 98 are bonded to the elastic members 10 by brazing or diffusion bonding. FIG. 20A shows an uncompressed condition of the shield board 95, and FIG. 20B shows a compressed condition of the shield board 95. By forming an engaging portion for the shield board 95 on each side plate 4a of the shelf 4 and engaging the shield board 95 in its compressed condition shown in FIG. 20B into this engaging portion of the shelf 4, the shield board 95 can be fixed to the shelf 4 by utilizing the resilience of the elastic members 100, thereby eliminating the need for any mechanical fixing means such as screws. The shield board 95 in its compressed condition shown in FIG. 20B is managed by the cutoff frequency fc specified by Eq. (1).

Figure 21:
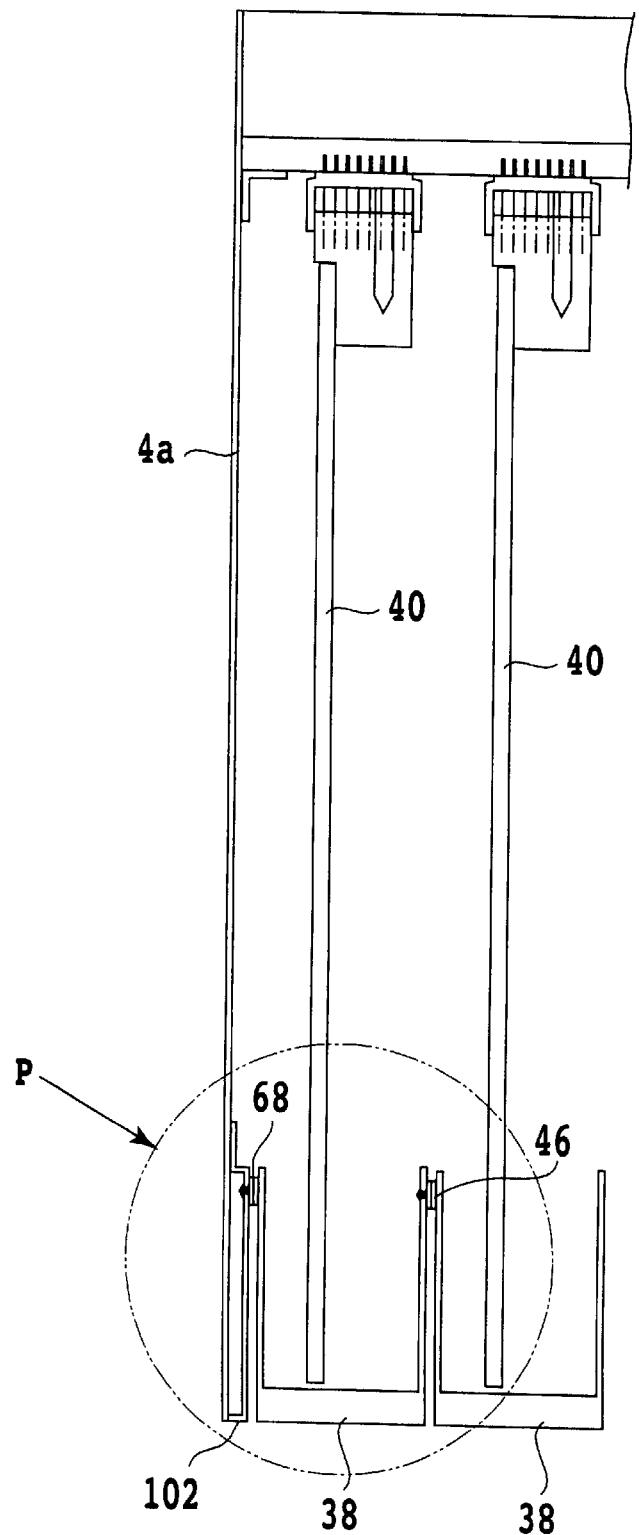
FIG. 21 is a plan view showing a gasket mounting portion of a shelf in the preferred embodiment.
Figure 22:
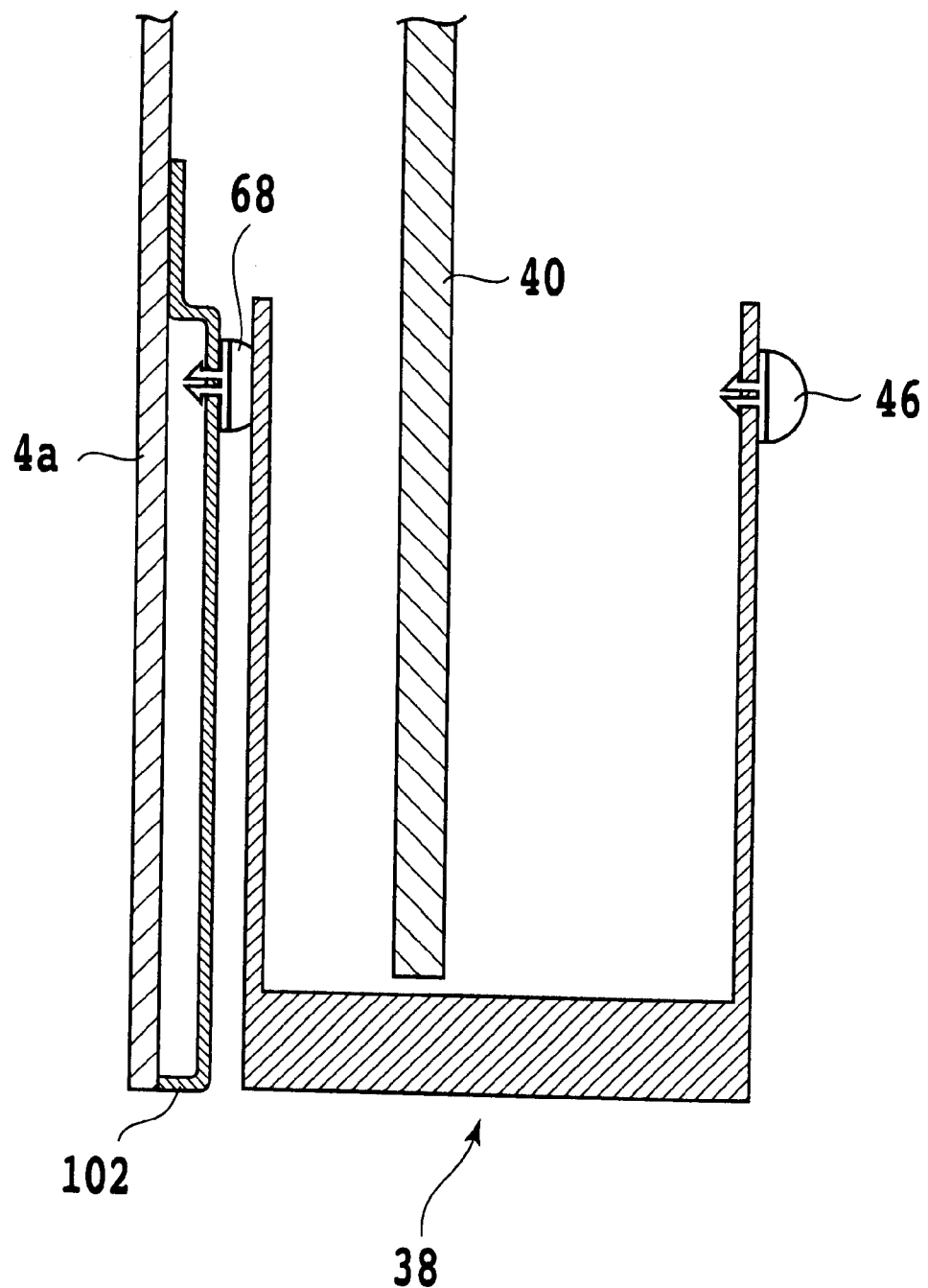
FIG. 22 is an enlarged view of an encircled portion P shown in FIG. 21.
Figure 23A:
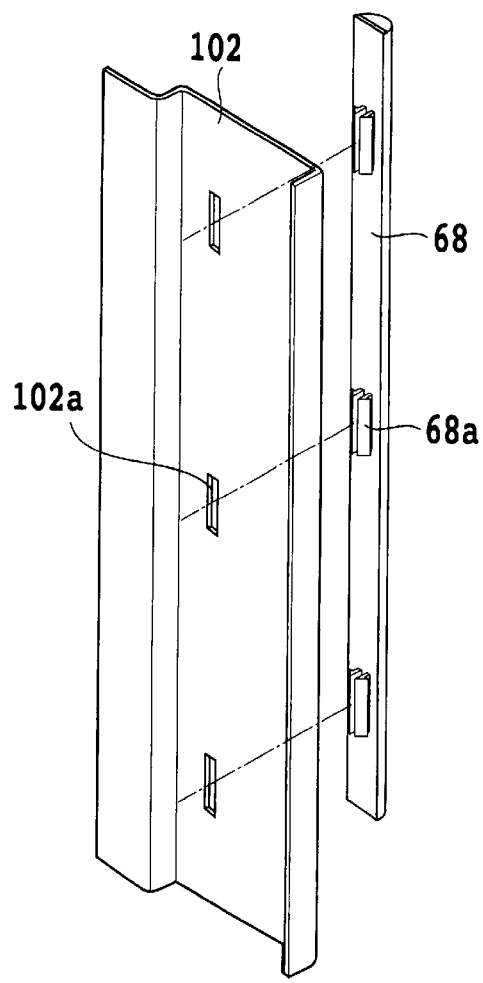
FIG. 23A is an exploded perspective view of a gasket and a bracket for mounting the gasket to the shelf.
Figure 23B:
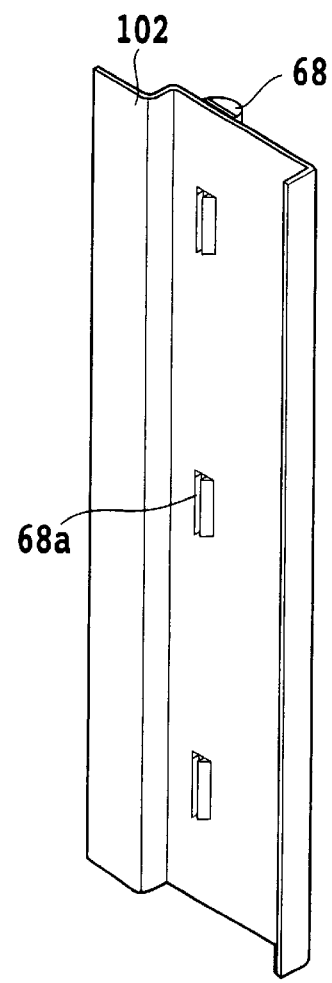
FIG. 23B is a perspective view showing a condition where the gasket is mounted on the bracket.

FIG. 21 is a schematic plan view showing a gasket mounting portion of the shelf 4. FIG. 22 is an enlarged view of an encircled portion P shown in FIG. 21. FIG. 23A is an exploded perspective view of the gasket 68 and a gasket mounting bracket 102, and FIG. 23B is a perspective view showing a condition where the gasket 68 is mounted on the bracket 102. As shown in FIGS. 23A and 23B, the gasket 68 has a plurality of projections 68a, and the bracket 102 has a plurality of holes 102a respectively engaging with the projections 68a of the gasket 68. The bracket 102 is fixed to the left side plate 4a of the shelf 4 by means of screws.

Figure 24:
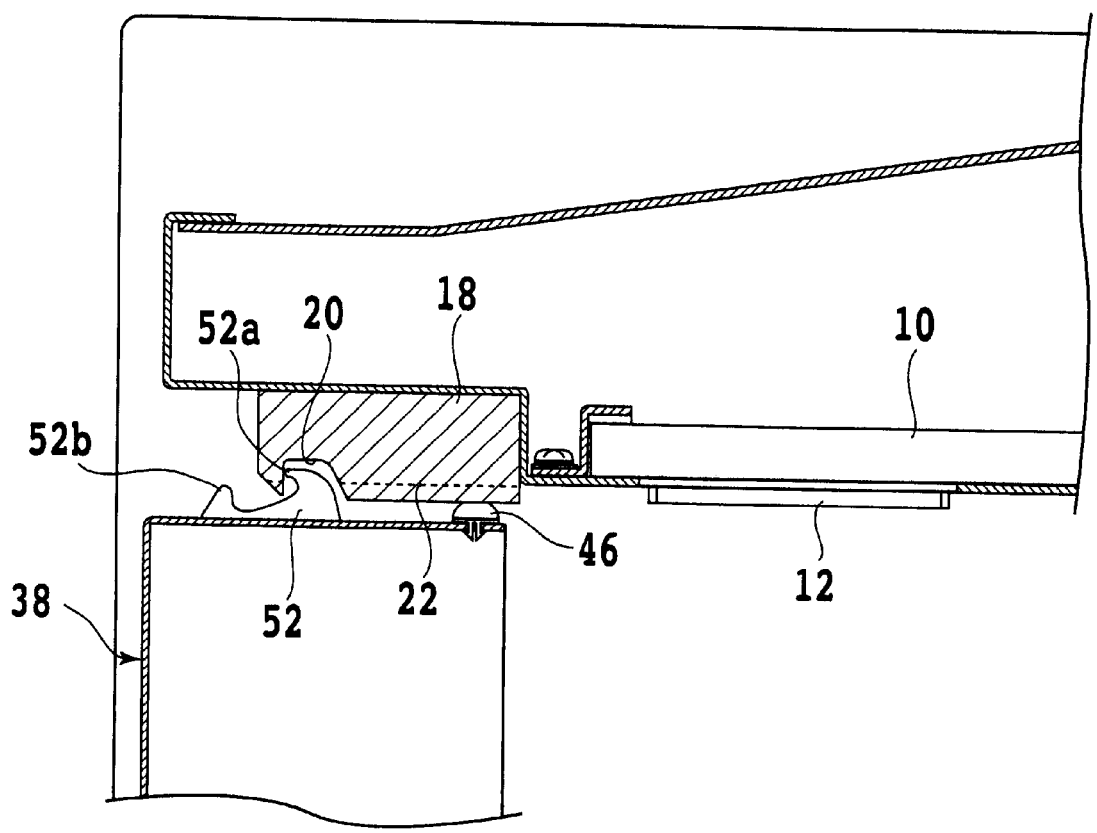
FIG. 24 is a sectional side view of the upper strike plate and each plug-in unit engaged therewith.
Figure 25:
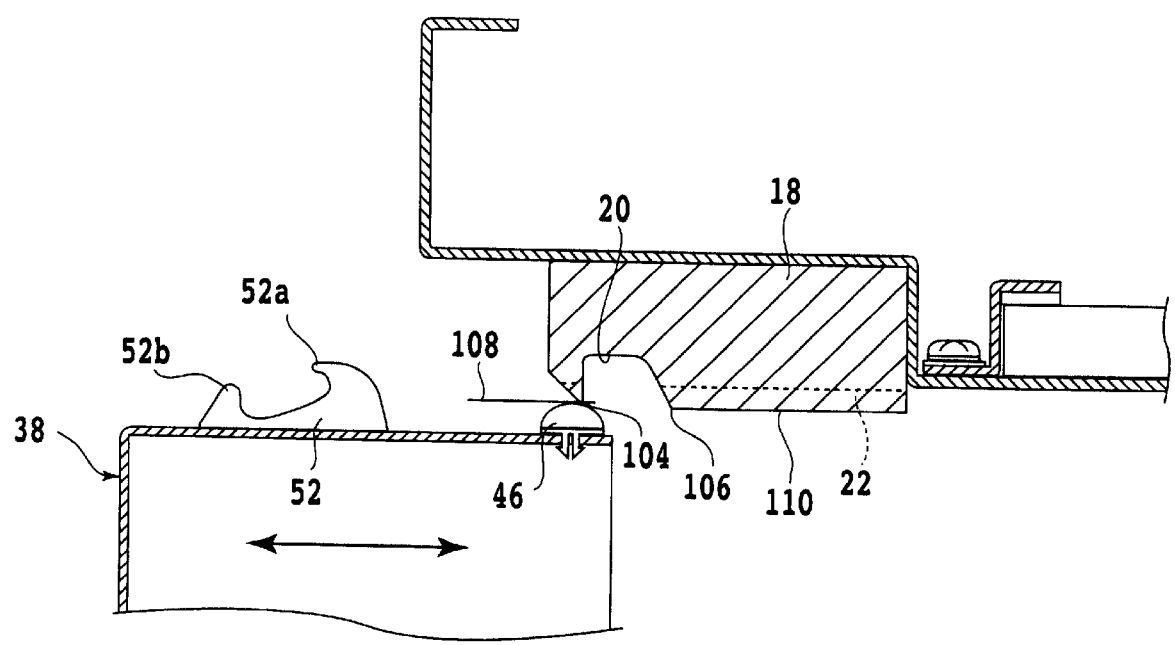
FIG. 25 is an enlarged sectional view showing the relation between the upper strike plate and a gasket mounted on each plug-in unit.

Referring to FIG. 24, there is shown a sectional side view of the upper strike plate 18 and each plug-in unit 38 engaged therewith. FIG. 25 is a sectional view showing the relation between the upper strike plate 18 and the gasket 46 mounted on each plug-in unit 38. In the condition where each plug-in unit 38 is fully inserted in the shelf 4 as shown in FIG. 24, a first engaging portion 52a of the lever 52 of each plug-in unit 38 is engaged with the front wall surface of the groove 20 of the strike plate 18, and the gasket 46 is in close contact with the lower surface of the strike plate 18 to achieve electromagnetic shield. A second engaging portion 52b of the lever 52 is used in ejecting the plug-in unit 38.

As shown in FIG. 25, the groove 20 of the strike plate 18 is defined by a pair of edge portions 104 and 106. The edge portions 104 and 106 are rounded to thereby reduce the stress on the gasket 46 in inserting and ejecting the plug-in unit 38. Furthermore, there is a difference in level between a horizontal plane 108 on the edge portion 104 and a lower surface 110 of the strike plate 18. More specifically, the level of the horizontal plane 108 is set higher than the level of the lower surface 110, thereby reducing the stress on the gasket 46 in inserting and ejecting the plug-in unit 38.

Each guide rail 12 of the upper guide plate 10 and each guide rail 22 of the upper strike plate 18 are higher in level than the contact surface between each gasket 46 and the upper strike plate 18. Similarly, each guide rail of the lower guide plate 24 and each guide rail of the lower strike plate 32 are lower in level than the contact surface between each gasket 46 and the lower strike plate 32. Accordingly, the vertical size of the printed wiring board 40 of each plug-in unit 38 can be enlarged to thereby increase a mount area on the printed wiring board 40.

Further, since the upper and lower strike plates 18 and 32 first meeting each plug-in unit 38 in inserting it into the shelf 4 are also formed with guide rails for guiding the printed wiring board 40 of each plug-in unit 38, each plug-in unit 38 can be easily inserted into the shelf 4 although the vertical size of the printed wiring board 40 is larger than the distance between the contact surface of the gasket 46 and the upper strike plate 18 and the contact surface of the gasket 46 and the lower strike plate 32.

Figure 26:
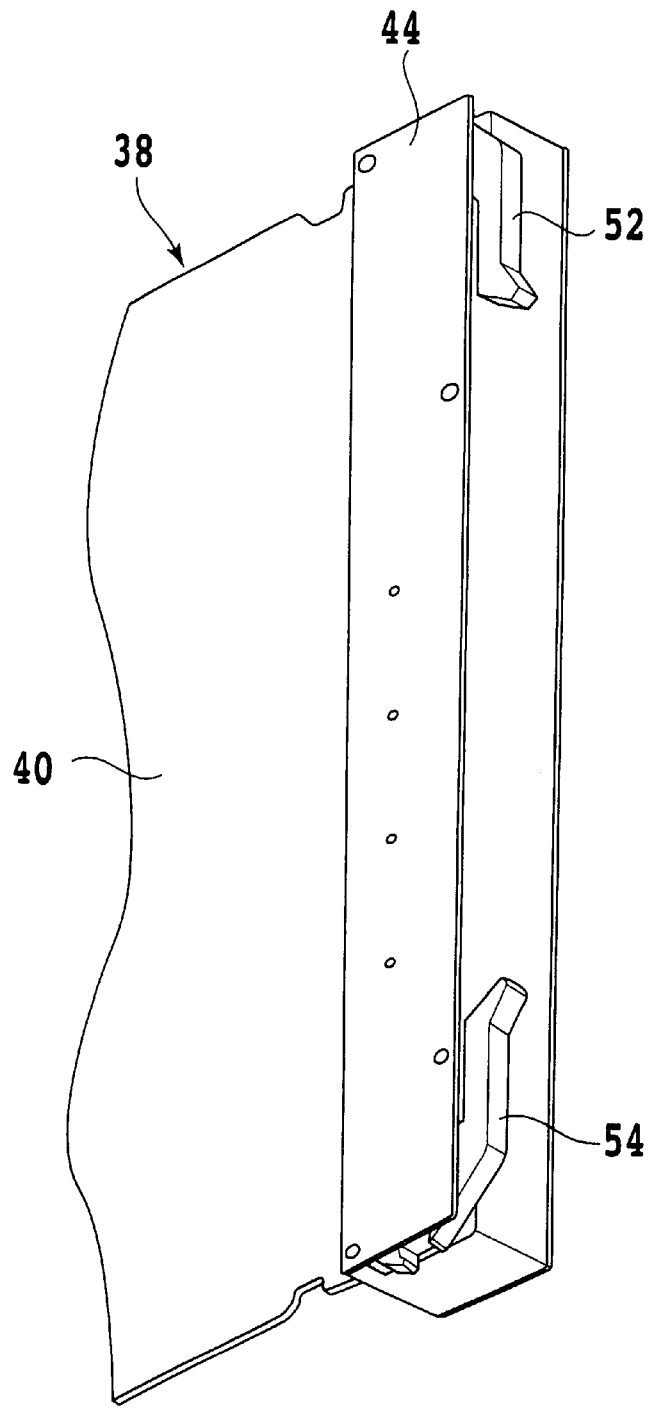
FIG. 26 is a partially cutaway, perspective view of each plug-in unit as viewed from the front side thereof.
Figure 27:
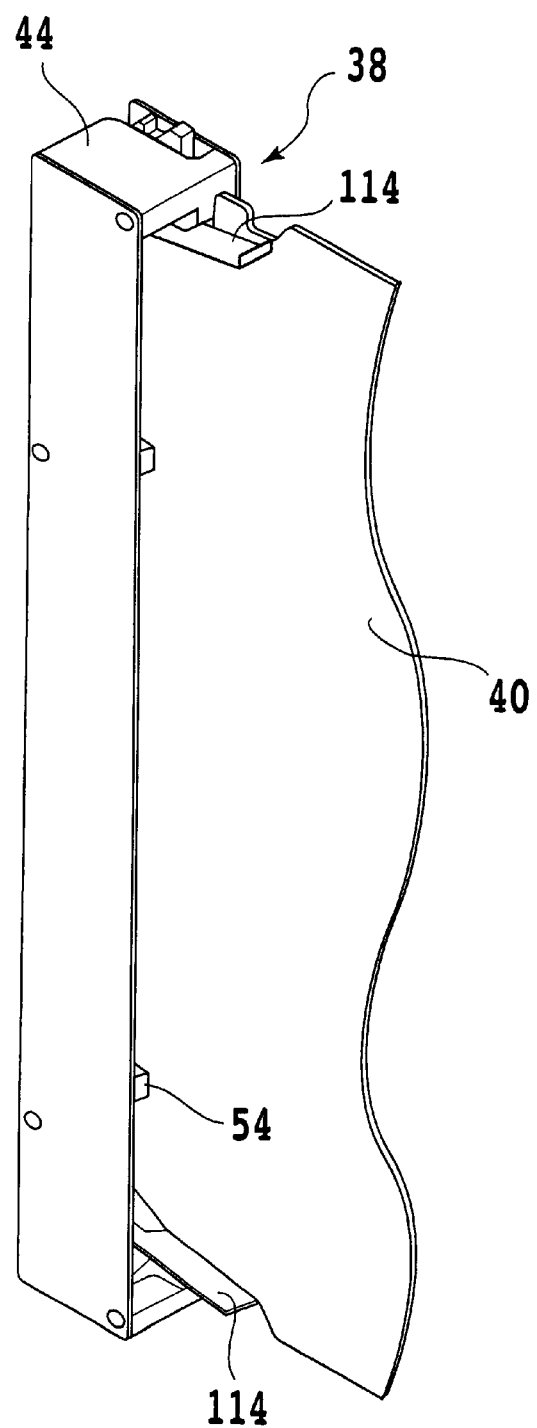
FIG. 27 is a partially cutaway, perspective view of each plug-in unit as viewed from the back side thereof.

FIG. 26 is a partially cutaway, perspective view of each plug-in unit 38 as viewed from the front side thereof, and FIG. 27 is a partially cutaway, perspective view of each plug-in unit 38 as viewed from the back side thereof. The levers 52 and 54 for use in inserting and ejecting the plug-in unit 38 are pivotably mounted at the upper and lower end portions of the front structure 44 of the plug-in unit 38, respectively. A pair of arms 114 are also pivotably mounted on the front structure 44 at its upper and lower end portions.

Figure 29:
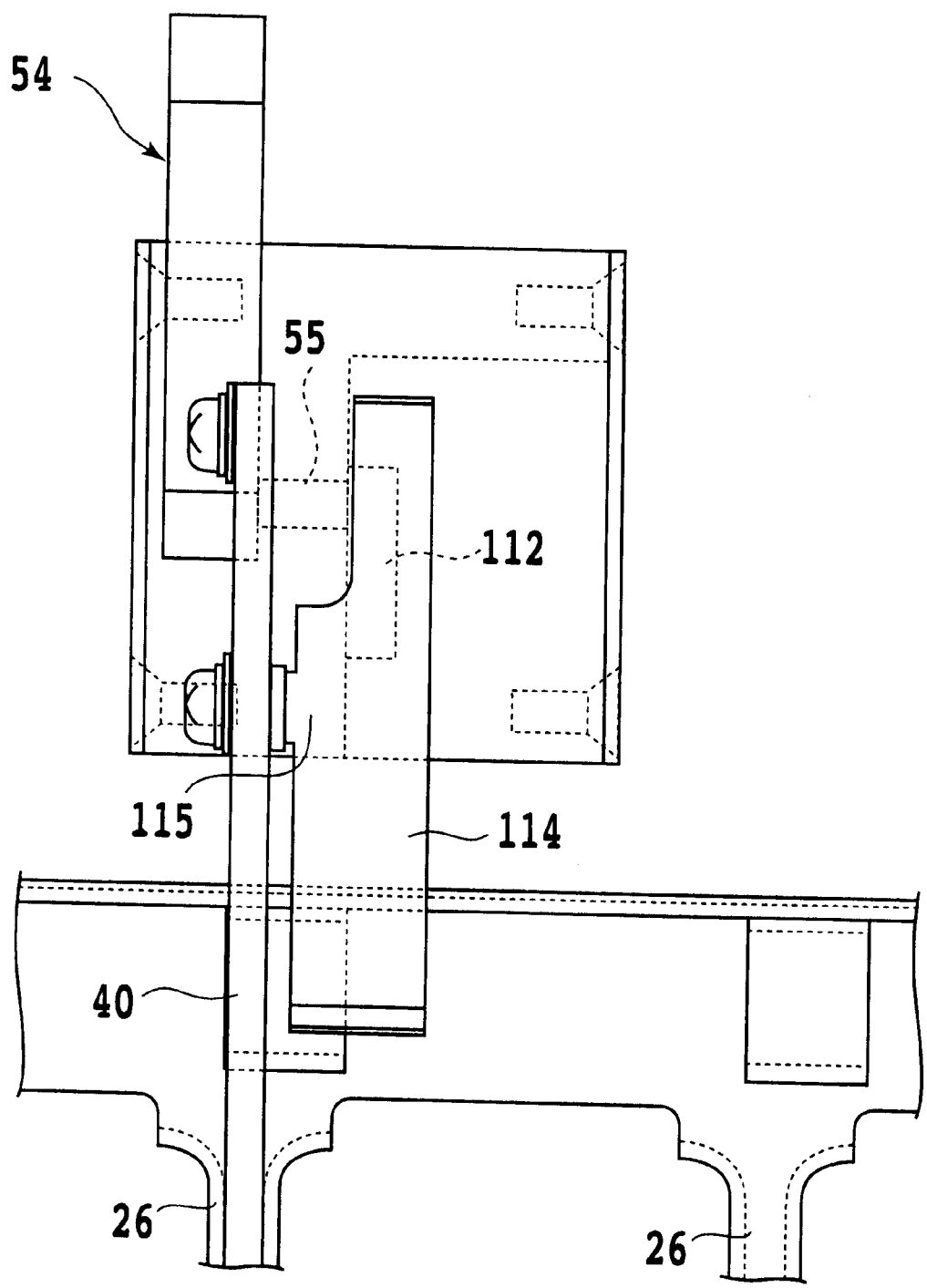
FIG. 29 is a bottom plan view of FIG. 28.

Referring to FIG. 28, there is shown a side view of an insertion/ejection mechanism for each plug-in unit 38. FIG. 29 is a bottom plan view of FIG. 28. In the condition where each plug-in unit 38 is fully inserted in the shelf 4 as shown in FIG. 28, a first engaging portion 54a of the lever 54 of each plug-in unit 38 is engaged with the front wall surface of the groove 34 of the strike plate 32. A second engaging portion 54b of the lever 54 is used in ejecting the plug-in unit 38.

A plurality of elastic lock members 116 upward biased are mounted on the lower guide plate 24. Similarly, a plurality of elastic lock members downward biased are mounted on the upper guide plate 10. The printed wiring board 40 of each plug-in unit 38 is formed at its lower end with a notch 118 for engaging each elastic lock member 116. Although not shown, a similar notch for engaging each elastic lock member mounted on the upper guide plate 10 is formed at the upper end of the printed wiring board 40 of each plug-in unit 38.

Referring to FIG. 29, the lever 54 and a rotary member 112 are pivotably mounted on the shaft 55 in the condition where a given angle is maintained between the lever 54 and the rotary member 112. The lower arm 114 is pivotably mounted on a shaft 115. Similarly, the upper arm 114 is also pivotably mounted on a shaft (not shown). The printed wiring board 40 of each plug-in unit 38 is guided by the corresponding guide rail 26 of the lower guide plate 24.

Figure 30A:
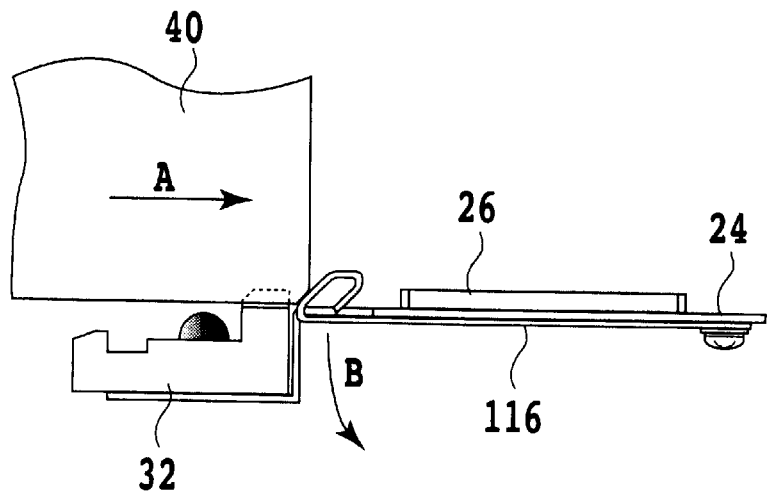
FIGS. 30A to 31B are side views for illustrating the operation of inserting each plug-in unit into the shelf.
Figure 30B:
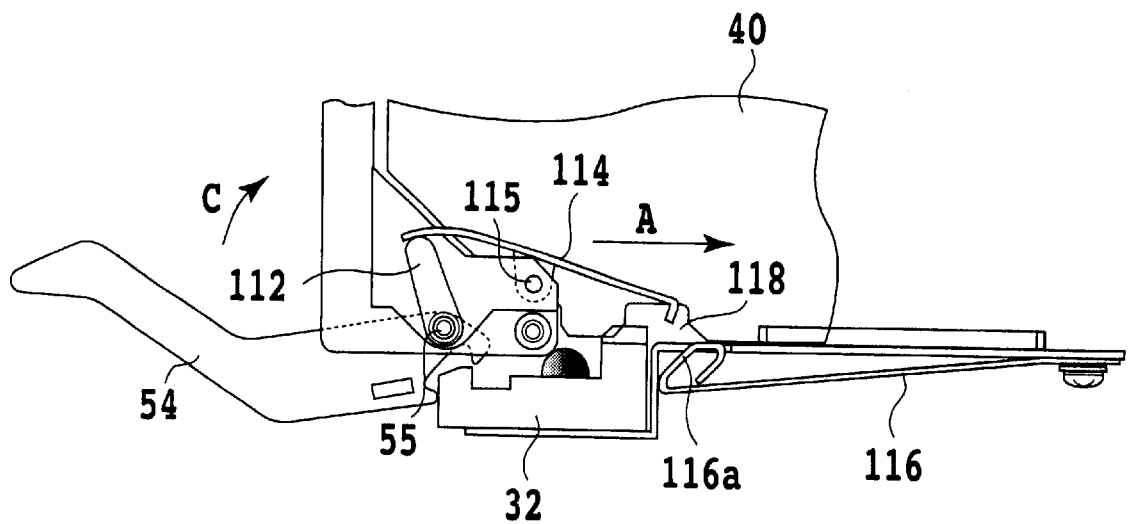

The operation of inserting each plug-in unit 38 into the shelf 4 will now be described with reference to FIGS. 30A to 31B. As shown in FIG. 30A, the elastic lock member 116 is depressed in the direction of arrow B by the printed wiring board 40 inserted in the direction of arrow A. As shown in FIG. 30B, the lever 54 is next rotated about the shaft 55 in the direction of arrow C. As a result, the rotary member 112 is also rotated about the shaft 55 together with the lever 54, and the arm 114 engaged with the rotary member 112 is also rotated about the shaft 115. However, the arm 114 does not function in the inserting operation of each plug-in unit 38.

Figure 31A:
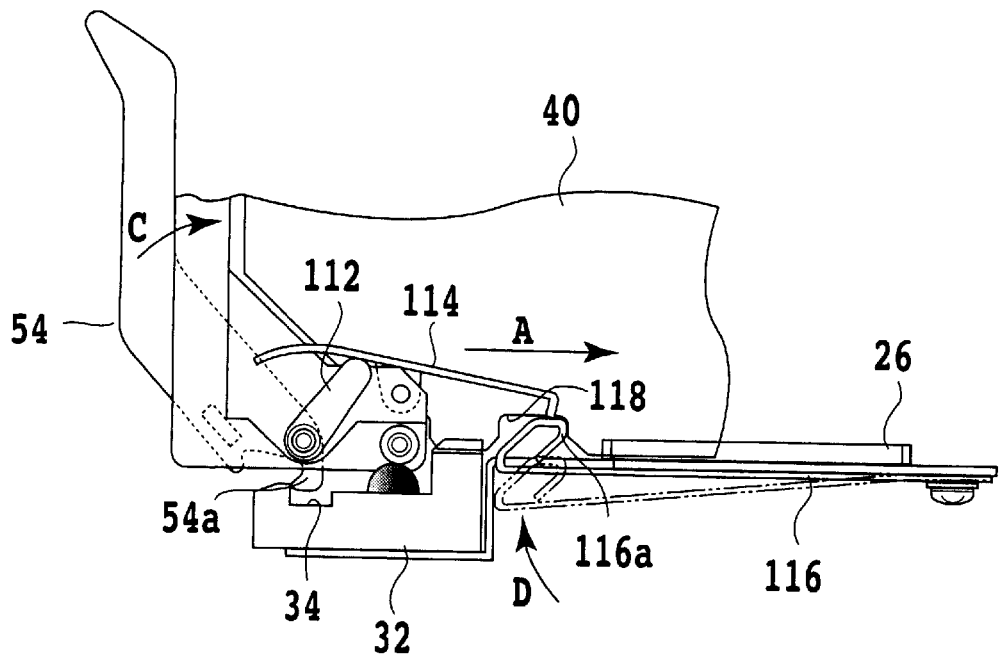

When the lever 54 is further rotated in the direction of arrow C as shown in FIG. 31A, the first engaging portion 54a of the lever 54 comes into engagement with the front wall surface of the groove 34 of the strike plate 32, so that the plug-in unit 38 is fully inserted into the shelf 4 by the leverage. At this time, the connectors 42 of the plug-in unit 38 comes into engagement with the connectors 8 of the back wiring board 6. Further, a head portion 116a of the elastic lock member 116 comes into engagement with the notch 118 of the printed wiring board 40 by its resiliency as shown by arrow D, thereby locking the printed wiring board 40.

Figure 31B:
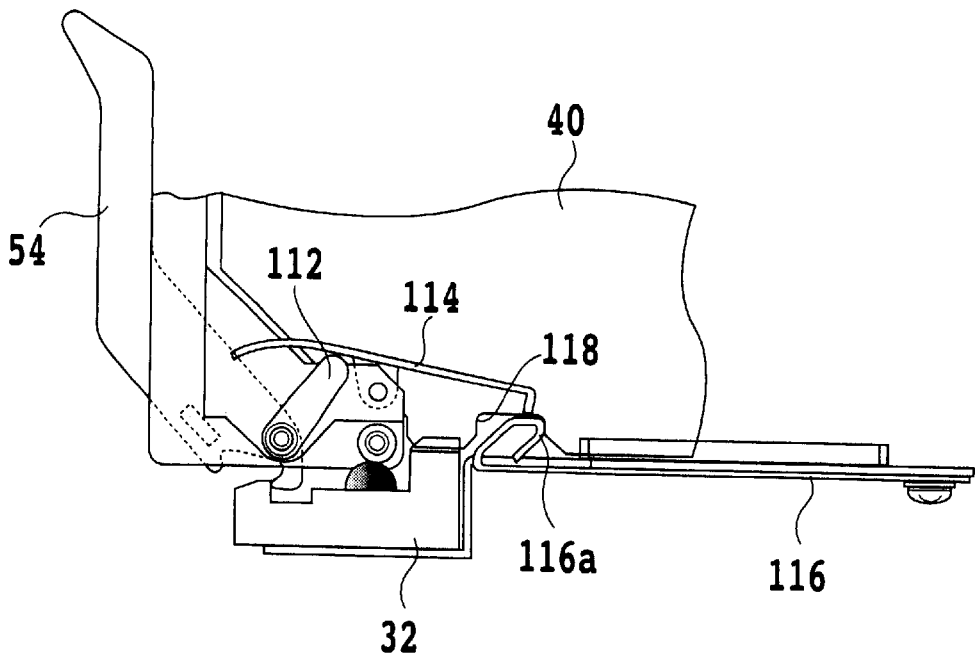

FIG. 31B shows such a fully inserted condition of each plug-in unit 38. In this condition, the printed wiring board 40 is completely locked by the elastic lock member 116 in such a manner that the head portion 116a of the elastic lock member 116 is engaged with the notch 118 of the printed wiring board 40 with the upward biasing force of the elastic lock member 116 kept applied to the printed wiring board 40. As a result, the plug-in unit 38 is prevented from being pulled to the front side with almost no play. Accordingly, it is possible to ensure a high reliability of connection between the connectors 42 of the plug-in unit 38 and the connectors 8 of the back wiring board 6.

Figure 32A:
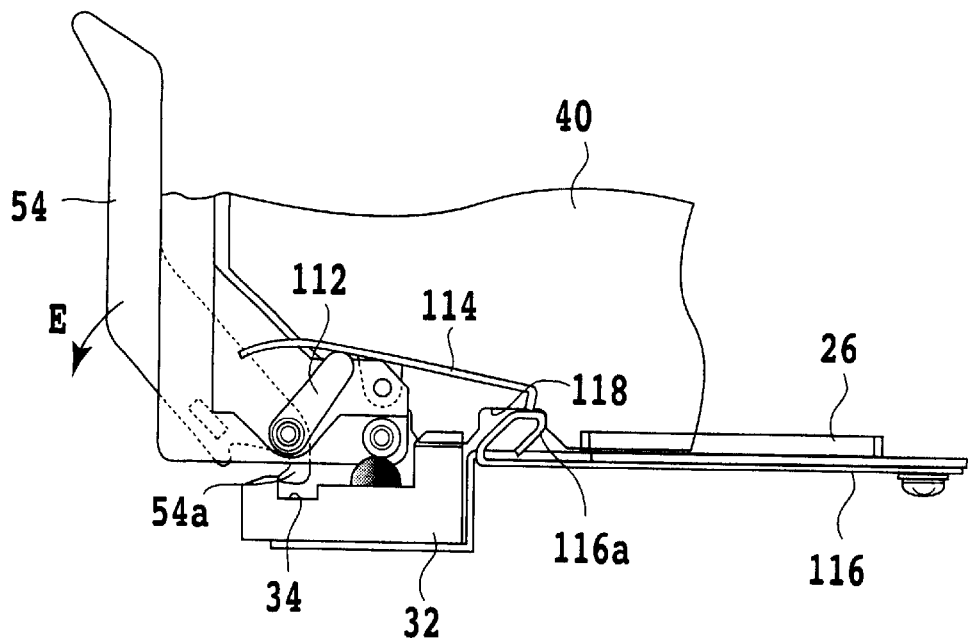
FIGS. 32A to 33B are side views for illustrating the operation of ejecting each plug-in unit from the shelf.
Figure 32B:
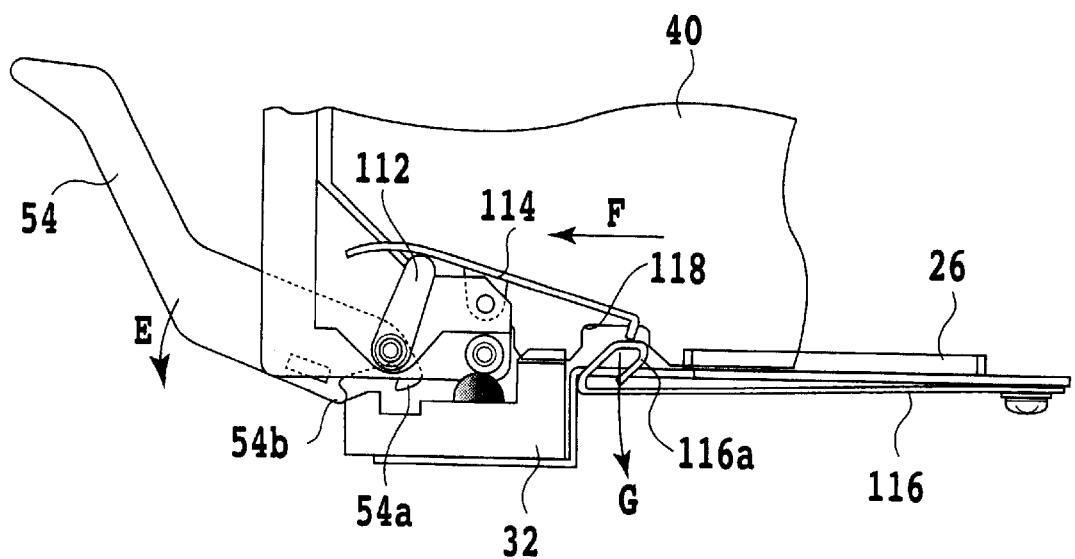

The operation of ejecting each plug-in unit 38 from the shelf 4 will now be described with reference to FIGS. 32A to 33B. The ejection of each plug-in unit 38 is started by rotating the lever 54 in the direction of arrow E as shown in FIG. 32A. When the lever 54 is further rotated as shown in FIG. 32B, the second engaging portion 54b of the lever 54 comes into engagement with the front end surface of the strike plate 32, thereby obtaining a large ejection force to pull the printed wiring board 40 in the direction of arrow F.

Figure 33A:
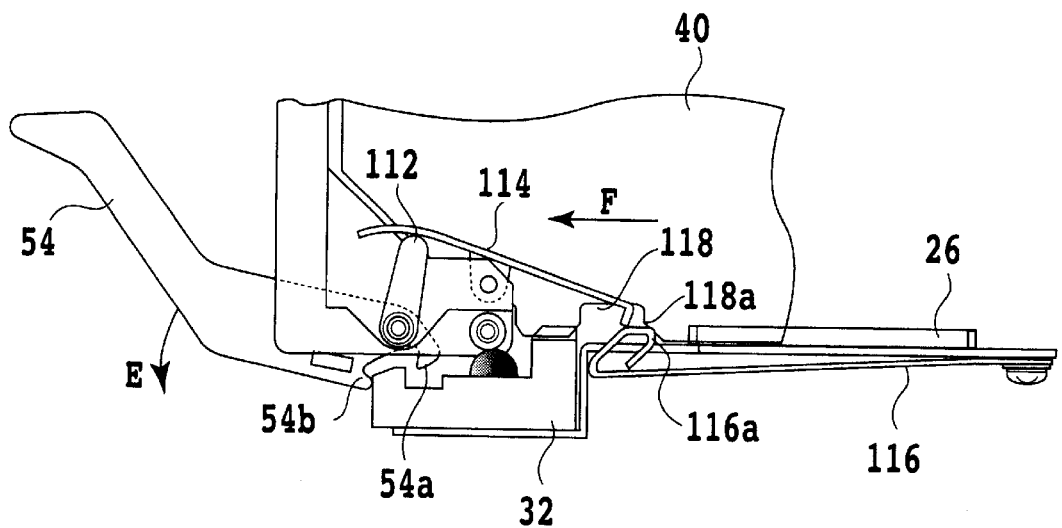
Figure 33B:
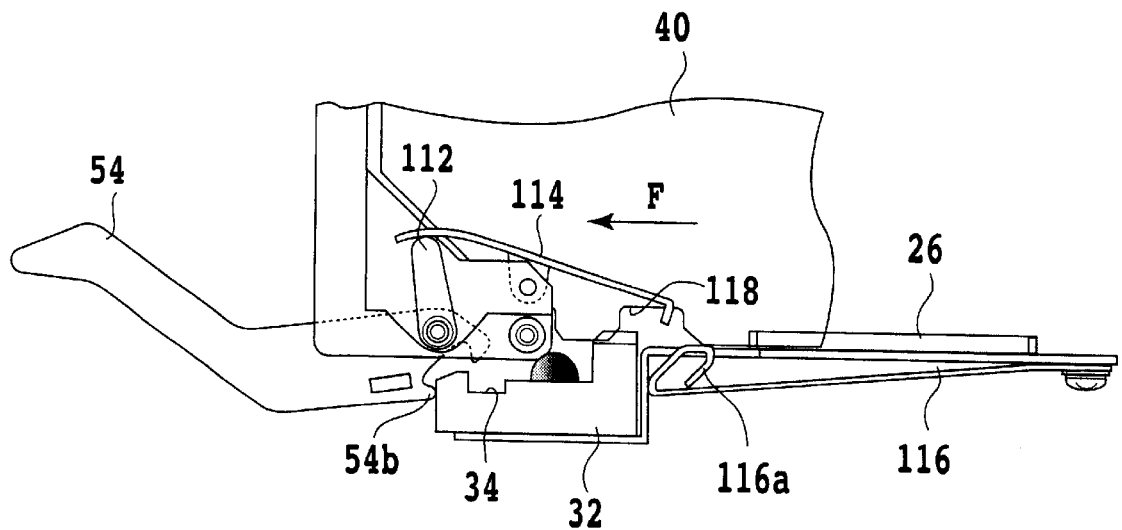

The rotary member 112 is also rotated together with the lever 54 to push up the left end portion of the arm 114. As a result, the right end portion of the arm 114 engaging with the head portion 116a of the elastic lock member 116 pushes down the head portion 116a in the direction of arrow G, so that the head portion 116a comes into disengagement from the notch 118 to thereby unlock the printed wiring board 40. Thereafter, the lever 54 is further rotated in the direction of arrow E as shown in FIG. 33A to pull the printed wiring board 40 in the direction of arrow F. At this time, the head portion 116a of the elastic lock member 116 is depressed by an inclined edge portion 118a of the notch 118 until the head portion 116a reaches the lower end of the printed wiring board 40 as shown in FIG. 33B. Finally, the lever 54 is fully rotated as shown in FIG. 33B and then pulled leftward as viewed in FIG. 33B to thereby complete the ejection of the plug-in unit 38.

Figure 34A:
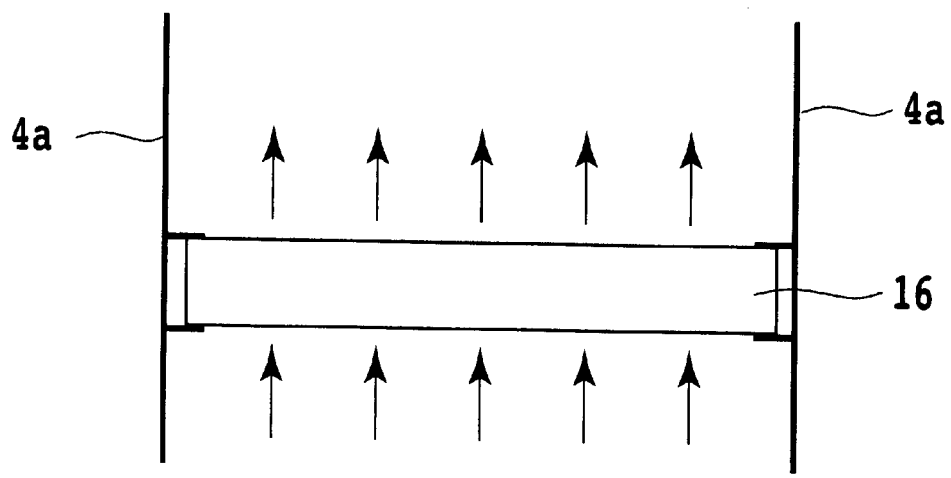
FIG. 34A is a schematic elevation showing a normally fixed condition of the honeycomb shield board to the shelf.
Figure 34B:
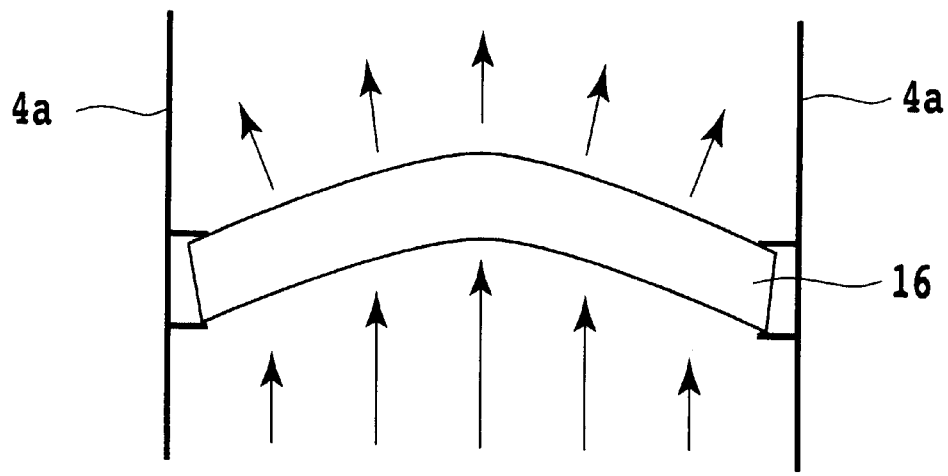
FIG. 34B is a view similar to FIG. 34A, showing a condition where the honeycomb shield board is bent.

FIG. 34A is a schematic elevation showing a normally fixed condition of the honeycomb shield board 16 to the shelf 4, and FIG. 34B is a view similar to FIG. 34A, showing a condition where the honeycomb shield board 16 is bent. In the normally fixed condition shown in FIG. 34A, a straight flow of cooling air is obtained by the straightening operation of the honeycomb shield board 16. In the fixed condition shown in FIG. 34B where the honeycomb shield board 16 is bent, the numerous openings of the honeycomb shield board 16 are deflected and the direction of the cooling air flow passing through the honeycomb shield board 16 is therefore deflected. Thus, by utilizing the flexibility of the honeycomb shield board 16 to bend it within its allowable limit of strength in fixing it to the shelf 4 as shown in FIG. 34B, the direction of the cooling air flow can be adjusted.

According to the present invention as described above, it is possible to provide a communication apparatus which can ensure sufficient FMI resistance and fire resistance, can maintain high cooling performance, and can mount heating components at a high density. Accordingly, a high reliability of a communication apparatus for ultrafast transmission can be ensured.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A communication apparatus comprising:

a shelf formed of metal, said shelf having a pair of side plates;

a back wiring board mounted in said shelf on the back side thereof, said back wiring board having a plurality of first connectors and a solid ground pattern;

an upper guide plate mounted in said shelf on the upper side thereof, said upper guide plate having a plurality of guide rails and a plurality of vent holes;

a first shield board mounted on said upper guide plate, said first shield board having numerous openings;

a lower guide plate mounted in said shelf on the lower side thereof, said lower guide plate having a plurality of guide rails and a plurality of vent holes;

a second shield board mounted on said lower guide plate, said second shield board having numerous openings;

a plurality of plug-in units mounted in said shelf so as to be inserted along said guide rails of said upper guide plate and said guide rails of said lower guide plate, each of said plug-in units having a printed wiring board, a second connector mounted on said printed wiring board and connected to one of said first connectors, a front structure fixed to the front end of said printed wiring board, said front structure having an upper surface, a pair of side surfaces, and a lower surface, and a first conductive gasket continuously mounted on said upper surface, one of said side surfaces, and said lower surface of said front structure; and a second conductive gasket mounted on one of said side plates of said shelf;

said second conductive gasket being in close contact with said front structure of one of said plug-in units adjacent to said one side plate of said shelf, said first conductive gasket of said one plug-in unit being in close contact with said front structure of another one of said plug-in units adjacent to said one plug-in unit or in close contact with the other side plate of said shelf, thereby realizing electromagnetic shield on the front side of said shelf;

said first shield board realizing electromagnetic shield on the upper side of said shelf;

said second shield board realizing electromagnetic shield on the lower side of said shelf;

said ground pattern of said back wiring board realizing electromagnetic shield on the back side of said shelf;

said side plates of said shelf realizing electromagnetic shield on the right and left sides of said shelf.

2. A communication apparatus according to claim 1, further comprising an external cable inserted in said front structure of each plug-in unit;

said front structure of each plug-in unit having a shielded external cable introducing portion for introducing said external cable to said printed wiring board.

3. A communication apparatus according to claim 1, further comprising:

an upper strike plate mounted on the front side of said upper guide plate; and a lower strike plate mounted on the front side of said lower guide plate.

4. A communication apparatus according to claim 3, wherein:

said upper surface of said front structure of each plug-in unit has a first projection; said lower surface of said front structure of each plug-in unit has a second projection;

said upper strike plate has a plurality of recesses for respectively engaging said first projections of said plug-in units; and said lower strike plate has a plurality of recesses for respectively engaging said second projections of said plug-in units.

5. A communication apparatus according to claim 4, wherein:

said recesses of said upper strike plate comprise a plurality of guide rails respectively aligned with said guide rails of said upper guide plate; and said recesses of said lower strike plate comprise a plurality of guide rails respectively aligned with said guide rails of said lower guide plate.

6. A communication apparatus according to claim 5, wherein:

said guide rails of said upper guide plate and said guide rails of said upper strike plate are higher in level than a contact surface between said first conductive gasket and said upper strike plate; and said guide rails of said lower guide plate and said guide rails of said lower strike plate are lower in level than a contact surface between said first conductive gasket and said lower strike plate.

7. A communication apparatus according to claim 3, wherein:

said upper surface of said front structure of each plug-in unit has a first recess;

said lower surface of said front structure of each plug-in unit has a second recess;

said upper strike plate has a plurality of projections for respectively engaging said first recesses of said plug-in units; and said lower strike plate has a plurality of projections for respectively engaging said second recesses of said plug-in units.

8. A communication apparatus according to claim 1, wherein each of said first and second shield boards comprises a honeycomb shield board having numerous honeycomb-shaped openings.

9. A communication apparatus according to claim 1, further comprising:

a first fan provided in said shelf at a position above said first shield board; and a second fan provided in said shelf at a position below said second shield board.

10. A communication apparatus according to claim 1, wherein:

said front structure of each plug-in unit has a pair of upper and lower levers pivotably mounted at upper and lower end portions, each of said levers having a first engaging portion and a second engaging portion;

said upper strike plate having a groove for engaging said first engaging portion of said upper lever;

said lower strike plate having a groove for engaging said first engaging portion of said lower lever.

11. A communication apparatus according to claim 10, wherein:

said upper guide plate has a plurality of first elastic lock members respectively corresponding to said plug-in units and biased downward;

said lower guide plate has a plurality of second elastic lock members respectively corresponding to said plug-in units and biased upward; and said printed wiring board of each plug-in unit has a first notch for engaging said corresponding first elastic lock member and a second notch for engaging said corresponding second elastic lock member.

12. A communication apparatus according to claim 11, wherein said front structure of each plug-in unit has a first unlocking mechanism for disengaging said corresponding first elastic lock member from said first notch, and a second unlocking mechanism for disengaging said corresponding second elastic lock member from said second notch.

13. A communication apparatus according to claim 12, wherein:

said first unlocking mechanism comprises an upper rotary member rotatable together with said upper lever and an upper arm pivotably mounted on said upper end portion of said front structure, said upper arm having one end portion adapted to be operated by said upper rotary member and another end portion for operating said first elastic lock member engaged with said first notch to disengage said first elastic lock member from said first notch; and said second unlocking mechanism comprises a lower rotary member rotatable together with said lower lever and a lower arm pivotably mounted on said lower end portion of said front structure, said lower arm having one end portion adapted to be operated by said lower rotary member and another end portion for operating said second elastic lock member engaged with said second notch to disengage said second elastic lock member from said second notch.

* * * * *